(12) United States Patent
Karim et al.

(10) Patent No.: US 7,958,626 B1
(45) Date of Patent: Jun. 14, 2011

(54) EMBEDDED PASSIVE COMPONENT NETWORK SUBSTRATE FABRICATION METHOD

(75) Inventors: Nozad Karim, Chandler, AZ (US); Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 807 days.

(21) Appl. No.: 11/924,156

(22) Filed: Oct. 25, 2007

(51) Int. Cl.
*H05K 3/30* (2006.01)
*H01L 21/8234* (2006.01)

(52) U.S. Cl. ............... 29/832; 29/825; 29/830; 29/840; 29/852; 438/238; 438/381

(58) Field of Classification Search ............... 29/825, 29/830, 832, 840, 952; 438/238, 381
See application file for complete search history.

(56) References Cited

U.S. PATENT DOCUMENTS

| | | | |
|---|---|---|---|
| 3,698,821 A | 10/1972 | Ekstrand | |
| 4,194,127 A | 3/1980 | Schmidt | |
| 4,776,022 A | 10/1988 | Fox et al. | |
| 5,108,541 A | 4/1992 | Schneider et al. | |
| 5,116,459 A | 5/1992 | Kordus et al. | |
| 5,181,445 A | 1/1993 | Cothrell | |
| 5,232,505 A | 8/1993 | Novak et al. | |
| 5,338,900 A | 8/1994 | Schneider et al. | |
| 5,369,431 A | 11/1994 | Levy et al. | |
| 5,506,793 A | 4/1996 | Straayer et al. | |
| 5,517,234 A | 5/1996 | Gerber et al. | |
| 5,784,484 A | 7/1998 | Umezawa | |
| 5,946,569 A | 8/1999 | Huang | |
| 6,021,380 A | 2/2000 | Fredriksen et al. | |
| 6,035,527 A | 3/2000 | Tamm | |
| 6,091,075 A | 7/2000 | Shibata et al. | |
| 6,194,250 B1 | 2/2001 | Melton et al. | |
| 6,303,423 B1 * | 10/2001 | Lin | 438/238 |
| 6,462,107 B1 | 10/2002 | Sinclair et al. | |
| 6,476,388 B1 | 11/2002 | Nakagaki et al. | |
| 6,603,877 B1 | 8/2003 | Bishop | |
| 6,730,857 B2 | 5/2004 | Konrad et al. | |
| 6,740,964 B2 | 5/2004 | Sasaki | |
| 6,869,870 B2 * | 3/2005 | Lin | 438/622 |
| 6,872,591 B1 | 3/2005 | Wang et al. | |
| 6,919,514 B2 | 7/2005 | Konrad et al. | |
| 7,242,081 B1 | 7/2007 | Lee | |
| 7,335,571 B2 | 2/2008 | Rumsey et al. | |
| 7,345,361 B2 | 3/2008 | Mallik et al. | |
| 7,372,151 B1 | 5/2008 | Fan et al. | |

(Continued)

OTHER PUBLICATIONS

Berry et al., "Thin Stacked Interposer Package", U.S. Appl. No. 11/865,617, filed Oct. 1, 2007.

(Continued)

*Primary Examiner* — C. J Arbes
(74) *Attorney, Agent, or Firm* — Gunnison, McKay & Hodgson, L.L.P.; Serge J. Hodgson

(57) ABSTRACT

A method of forming an embedded passive component network substrate includes providing a first carrier with a first dielectric layer and patterning the first dielectric layer to form a first patterned dielectric layer including circuit pattern artifacts. A first etch stop layer is plated within the circuit pattern artifacts. A first conductor layer is plated on the first etch stop layer and within the circuit pattern artifacts. The first etch stop layer and the first conductor layer form a first etch stop metal protected circuit pattern comprising a passive component embedded with the first patterned dielectric layer.

24 Claims, 22 Drawing Sheets

U.S. PATENT DOCUMENTS

| | | | |
|---|---|---|---|
| 7,384,864 B2 * | 6/2008 | Lin ............................... | 438/622 |
| 7,396,756 B2 * | 7/2008 | Lin ............................... | 438/618 |
| 7,420,276 B2 * | 9/2008 | Lin et al. ....................... | 257/758 |
| 7,553,738 B2 * | 6/2009 | Min et al. ...................... | 438/399 |
| 7,714,996 B2 | 5/2010 | Yan et al. | |
| 7,741,698 B2 * | 6/2010 | Chinthakindi et al. ....... | 257/531 |
| 7,763,954 B2 * | 7/2010 | Chinthakindi et al. ....... | 257/533 |
| 2001/0017694 A1 | 8/2001 | Oomori et al. | |
| 2003/0076666 A1 | 4/2003 | Daeche et al. | |
| 2004/0021201 A1 | 2/2004 | Ballantine et al. | |
| 2004/0043551 A1 | 3/2004 | Beroz | |
| 2004/0104417 A1 | 6/2004 | Song et al. | |
| 2004/0120570 A1 | 6/2004 | Levi et al. | |
| 2004/0183094 A1 | 9/2004 | Caletka et al. | |
| 2004/0239918 A1 | 12/2004 | Sugihara et al. | |
| 2005/0116337 A1 | 6/2005 | Chua et al. | |
| 2005/0194533 A1 | 9/2005 | Okuda et al. | |
| 2006/0124874 A1 | 6/2006 | Uto et al. | |
| 2007/0206267 A1 | 9/2007 | Tung et al. | |
| 2007/0273014 A1 | 11/2007 | Lee et al. | |
| 2007/0273049 A1 | 11/2007 | Khan et al. | |
| 2007/0290376 A1 | 12/2007 | Zhao et al. | |
| 2008/0003414 A1 | 1/2008 | Magera et al. | |
| 2008/0122079 A1 | 5/2008 | Chen et al. | |
| 2008/0136041 A1 | 6/2008 | Kotake et al. | |
| 2008/0225283 A1 | 9/2008 | Chi et al. | |
| 2008/0230887 A1 | 9/2008 | Sun et al. | |
| 2009/0229856 A1 | 9/2009 | Fredenberg et al. | |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", $58^{th}$ *ECTC Proceedings*, May 2008, Lake Buena Vista, FL, 6 pages, IEEE.

Huemoeller et al., U.S. Appl. No. 11/765,806, filed Jun. 20, 2007, entitled "Metal Etch Stop Fabrication Method and Structure".

Huemoeller et al., U.S. Appl. No. 11/765,828, filed Jun. 20, 2007, entitled "Embedded Die Metal Etch Stop Fabrication Method and Structure".

* cited by examiner

US 7,958,626 B1

EMBEDDED PASSIVE COMPONENT NETWORK SUBSTRATE FABRICATION METHOD

BACKGROUND OF THE INVENTION

1. Field of the Invention

The present invention relates generally to substrates for mounting of electronic components and the resulting packages. More particularly, the present invention relates to a method of fabricating an embedded passive component network substrate and the resulting structure.

2. Description of the Related Art

A passive component such as a capacitor, an inductor, a transformer, a resistor, and/or combinations thereof, is typically surface mounted as a discrete passive component to a substrate. However, the solder joints which physically and electrically connect the passive component to the substrate can crack or otherwise fail. Further, as the passive component is surface mounted to the substrate, the passive component protrudes from the exterior surface of the substrate thus increasing the overall size of the assembly.

SUMMARY OF THE INVENTION

In accordance with one embodiment, a method of forming an embedded capacitive network substrate includes providing a first carrier with a first dielectric layer and patterning the first dielectric layer to form a first patterned dielectric layer including circuit pattern artifacts. The circuit pattern artifacts include capacitor plate apertures. A first etch stop layer is plated within the circuit pattern artifacts. A first conductor layer is plated on the first etch stop layer and within the circuit pattern artifacts. The first etch stop layer and the first conductor layer form a first etch stop metal protected circuit pattern comprising a first capacitor embedded with the first patterned dielectric layer. The capacitor is embedded within the first patterned dielectric layer thus obviating the need for surface mounted capacitors.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
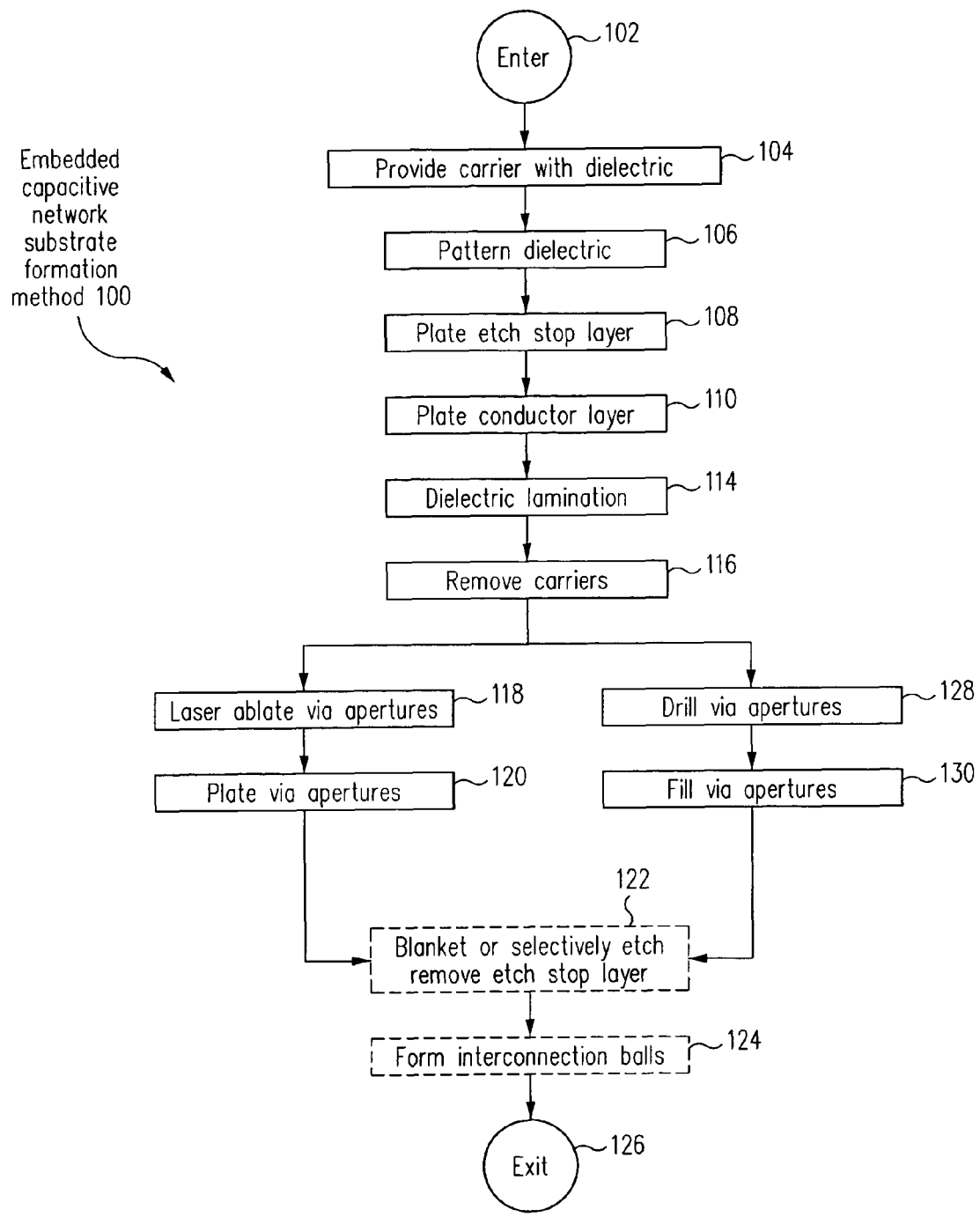
FIG. 1 is an embedded capacitive network substrate formation method for fabricating an embedded capacitive network substrate in accordance with one embodiment of the present invention.
Figure 2:
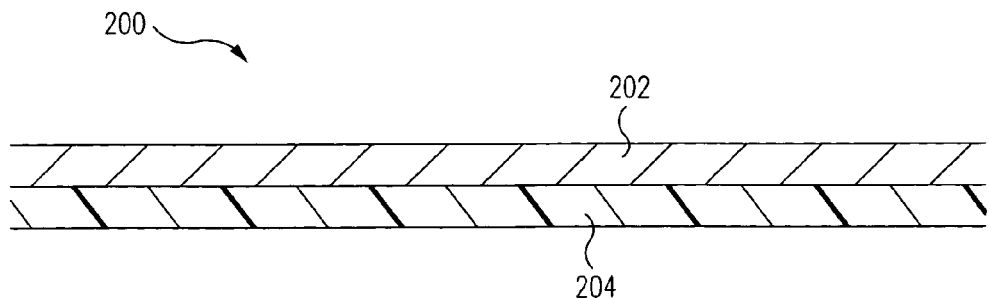
FIG. 2 is a cross-sectional view of an embedded capacitive network substrate during fabrication in accordance with one embodiment.
Figure 3:
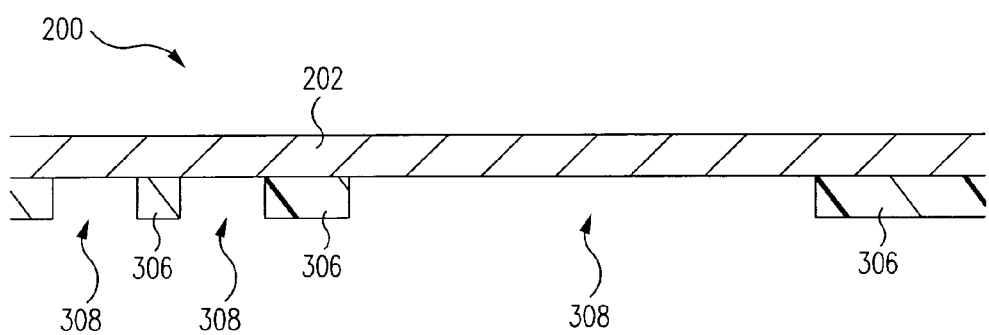
FIGS. 3 and 4 are cross-sectional views of the substrate of FIG. 2 at various stages during fabrication in accordance with various embodiments of the present invention.
Figure 4:
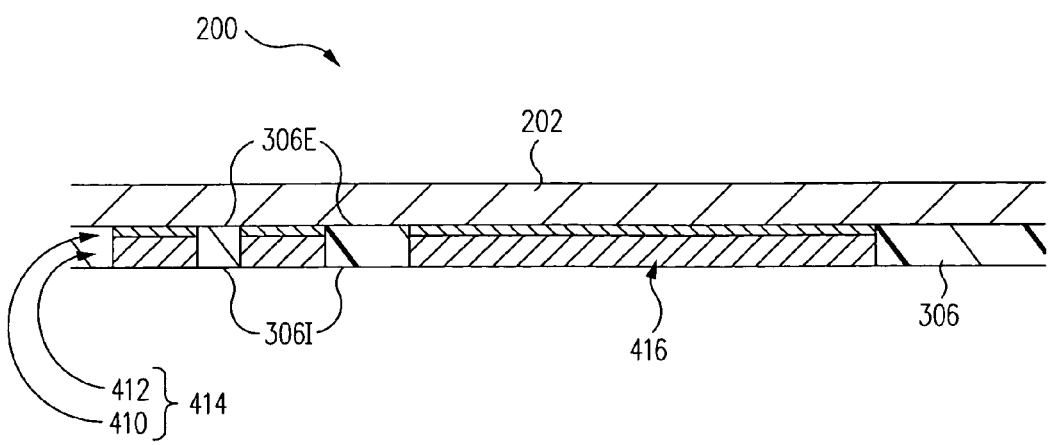

FIG. 1 is an embedded capacitive network substrate formation method 100 for fabricating an embedded capacitive network substrate in accordance with one embodiment of the present invention. FIG. 2 is a cross-sectional view of an embedded capacitive network substrate 200 during fabrication in accordance with one embodiment. FIGS. 3 and 4 are cross-sectional views of substrate 200 of FIG. 2 at various stages during fabrication in accordance with various embodiments of the present invention.

Referring now to FIGS. 1 and 2 together, from an enter operation 102, flow moves to a provide carrier with dielectric operation 104. In provide carrier with dielectric operation 104, a carrier 202 is provided with a dielectric layer 204.

Carrier 202 is an electrically conductive material, e.g., copper. Dielectric layer 204 is a layer of dielectric, e.g., dielectric tape, dielectric film, adhesive, or other dielectric. In one embodiment, alignment holes and/or fiducials are punched.

Referring now to FIGS. 1, 2 and 3 together, from provide carrier with dielectric operation 104, flow moves to a pattern dielectric operation 106. In pattern dielectric operation 106, dielectric layer 204 of substrate 200 of FIG. 2 is patterned to form a patterned dielectric layer 306 as illustrated in FIG. 3. Dielectric layer 204 is patterned using laser-ablation in one embodiment. In another embodiment, a photolithography process is used.

Dielectric layer 204 is patterned to expose portions of carrier 202. More particularly, dielectric layer 204 is patterned to form circuit pattern artifacts 308, i.e., openings, within dielectric layer 204. Stated another way, patterned dielectric layer 306 includes circuit pattern artifacts 308. Carrier 202 is exposed through circuit pattern artifacts 308.

Illustratively, circuit pattern artifacts 308 include trace channels, land apertures, and capacitor plate apertures in which traces, lands and capacitor plates are formed as discussed below.

Referring now to FIGS. 1 and 4 together, from pattern dielectric operation 106, flow moves to a plate etch stop layer operation 108. In plate etch stop layer operation 108, a patterned etch stop layer 410 of an etch stop metal is plated within circuit pattern artifacts 308 of patterned dielectric layer 306.

From plate etch stop layer operation 108, flow moves to a plate conductor layer operation 110. In plate conductor layer operation 110, a patterned conductor layer 412 of a conductor metal is plated on patterned etch stop layer 410 within circuit pattern artifacts 308 of patterned dielectric layer 306.

The etch stop metal, e.g., nickel, tin, gold, or palladium, of patterned etch stop layer 410 is selectively etchable compared to the conductor metal, e.g., copper, silver, or solder, of patterned conductor layer 412. Patterned etch stop layer 410 and patterned conductor layer 412 thus form an etch stop metal protected circuit pattern 414 on carrier 202 and within circuit pattern artifacts 308 of patterned dielectric layer 306. Stated another way, etch stop metal protected circuit pattern 414 is a bi-layer structure including patterned etch stop layer 410 and patterned conductor layer 412.

In accordance with one embodiment, carrier 202 is used as the electrode for electroplating of patterned etch stop layer 410 and patterned conductor layer 412. Patterned etch stop layer 410 and patterned conductor layer 412 are electroplated using carrier 202 as the electrode using any one of a number of electroplating techniques well known to those of skill in the art, and the particular technique used is not essential to this embodiment.

By using carrier 202 as the electroplating electrode, an electroless plating operation and associated desmear process are avoided, thus simplifying manufacturing and reducing fabrication cost as compared to using an electroless plating operation. However, in one embodiment, patterned etch stop layer 410 and/or patterned conductor layer 412 are plated using an electroless plating operation.

Further, by using carrier 202 as the electroplating electrode, relatively large circuit pattern artifacts 308 are reliably plated.

Patterned conductor layer 412, i.e., the interior surface (lower in the view of FIG. 4), is substantially coplanar with an interior surface 306I of patterned dielectric layer 306. Patterned etch stop layer 410, i.e., the exterior surface (upper in the view of FIG. 4), is substantially coplanar with an exterior surface 306E of patterned dielectric layer 306.

Etch stop metal protected circuit pattern 414 includes electrically conductive traces, lands, and at least one capacitor 416. Capacitor 416 is embedded within patterned dielectric layer 306 thus obviating the need for surface mounted capacitors.

As is well known to those of skill in the art, a capacitor is a device giving capacitance that includes conducting plates separated by dielectric material. A capacitor stores electrical energy by having the plates on opposite sides of the dielectric material oppositely charged by a source of voltage.

Figure 5:
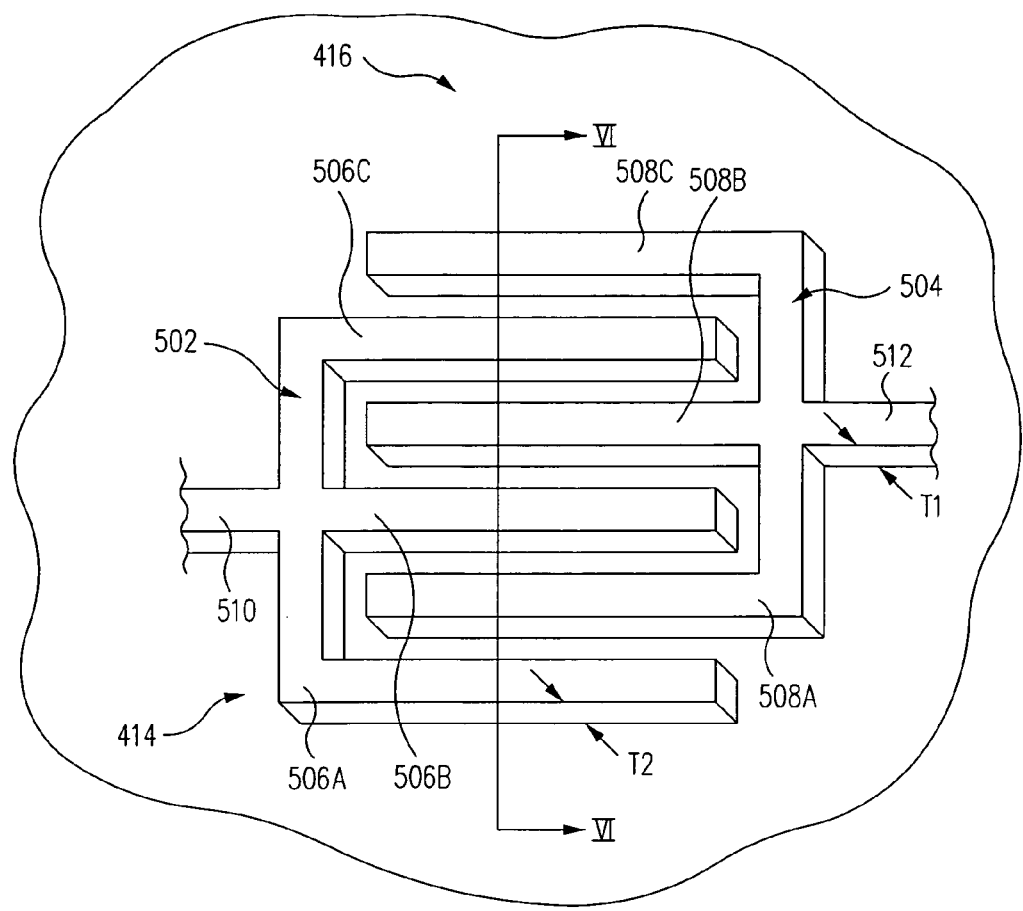
FIG. 5 is a perspective view of a capacitor of FIG. 4 in accordance with one embodiment.
Figure 6:
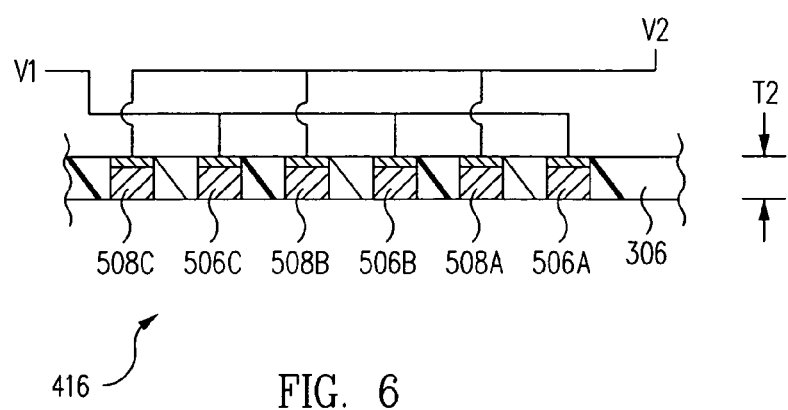
FIG. 6 is a cross-sectional view of the capacitor of FIG. 5 along the line VI-VI.

FIG. 5 is a perspective view of capacitor 416 of FIG. 4 in accordance with one embodiment. FIG. 6 is a cross-sectional view of capacitor 416 of FIG. 5 along the line VI-VI. For clarity of presentation, carrier 202 and patterned dielectric layer 306 are not illustrated in FIG. 5 and carrier 202 is not illustrated in FIG. 6. Further, in FIG. 5, etch stop metal protected circuit pattern 414 is illustrated as a single conductor layer although it is to be understood that etch stop metal protected circuit pattern 414 is a bi-layer structure including patterned etch stop layer 410 and patterned conductor layer 412 as illustrated in FIGS. 4 and 6.

Referring now to FIGS. 5 and 6 together, capacitor 416 includes capacitor plates 502, 504 separated by patterned dielectric layer 306, which forms the dielectric material for capacitor 416 in this embodiment.

Capacitor plate 502 and capacitor plate 504 include fingers 506A, 506B, 506C, and fingers 508A, 508B, 508C, respectively. Fingers 506A, 506B, 506C, collectively first fingers 506, are interdigitated with fingers 508A, 508B, 508C, collectively second fingers 508. More particularly, in the horizontal, e.g., first, direction, finger 508A is between fingers 506A, 506B, finger 506B is between fingers 508A, 508B, finger 508B is between fingers 506B, 506C, and finger 506C is between fingers 508B, 508C.

Although capacitor plates 502, 504 are illustrated and set forth herein as each including three fingers 506, 508, in accordance with other embodiments, capacitor plates having more or less than three fingers are formed.

Capacitor plates 502, 504 are electrically connected to traces 510, 512 of etch stop metal protected circuit pattern 414. In one embodiment, trace 510, e.g., a first trace, is electrically connected to a first voltage source and has an applied voltage V1 and trace 512, e.g., second trace, is electrically connected to a second voltage source and has an applied voltage V2.

As capacitor plates 502, 504, and traces 510, 512 are all parts of etch stop metal protected circuit pattern 414, a first thickness T1 of traces 510, 512 in the vertical, e.g., second, direction is equal to a second thickness T2 of capacitor plates 502, 504.

Figure 7:
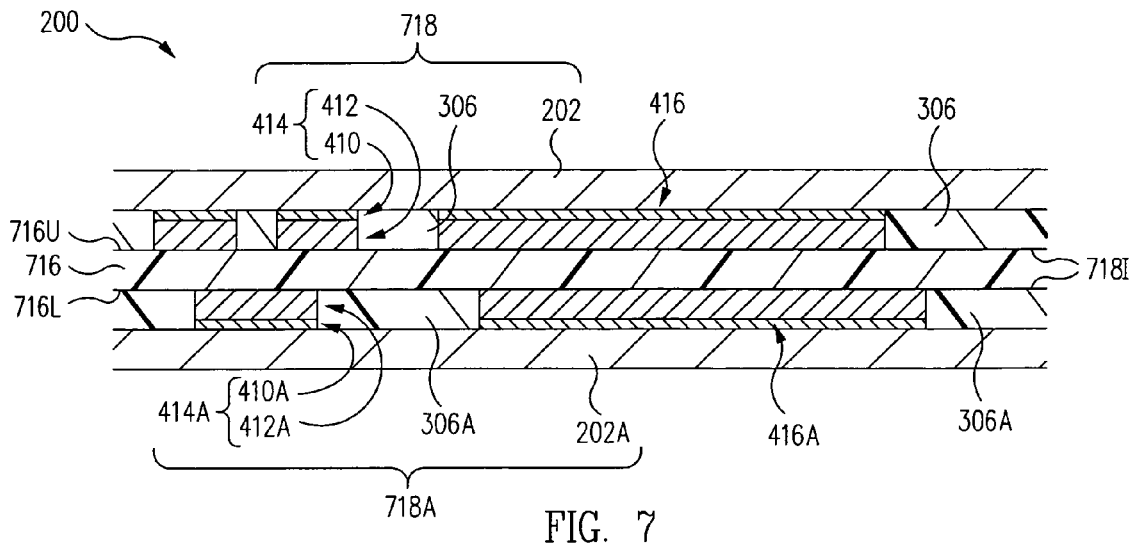
FIGS. 7, 8, 9, 10, 11, 12, and 13 are cross-sectional views of the substrate of FIG. 4 at various stages during fabrication in accordance with various embodiments of the present invention.

FIGS. 7, 8, 9, 10, 11, 12, and 13 are cross-sectional views of substrate 200 of FIG. 4 at various stages during fabrication in accordance with various embodiments of the present invention. Referring now to FIGS. 1 and 7 together, from plate conductor layer operation 110, flow moves to a dielectric lamination operation 114. In dielectric lamination operation 114, etch stop metal protected circuit patterns 414, 414A are laminated to an intermediary dielectric layer 716.

More particularly, as shown in FIG. 7, etch stop metal protected circuit pattern 414 of FIG. 4 is laminated into an upper, e.g., first, surface 716U of dielectric layer 716. A lower etch stop metal protected circuit pattern 414A is laminated into a lower, e.g., second, surface 716L of dielectric layer 716. Lower etch stop metal protected circuit pattern 414A includes electrically conductive traces, lands, and at least one capacitor 416A, although is formed with an absence of (without any) capacitors in another embodiment.

Second etch stop metal protected circuit pattern 414A is on a carrier 202A and within a patterned dielectric layer 306A. Second etch stop metal protected circuit pattern 414A includes a patterned etch stop layer 410A and a patterned conductor layer 412A. Second etch stop metal protected circuit pattern 414A is formed on carrier 202A and within patterned dielectric layer 306A in a manner similar or identical to the formation of etch stop metal protected circuit pattern 414 on carrier 202, and so is not repeated again. In the view of FIG. 7, patterned conductor layer 412A is above patterned etch stop layer 410A whereas patterned conductor layer 412 is below patterned etch stop layer 410 facilitating lamination of patterned conductor layers 412, 412A into dielectric layer 716.

Etch stop metal protected circuit pattern 414, carrier 202, and patterned dielectric layer 306 form an etch stop metal protected circuit pattern carrier structure 718. Generally, the interior surface of patterned conductor layer 412 and interior surface 306I of patterned dielectric layer 306 collectively form an interior planar surface 718I of etch stop metal protected circuit pattern carrier structure 718.

Etch stop metal protected circuit pattern 414, carrier 202, and patterned dielectric layer 306 are sometimes referred to upper, e.g., first, etch stop metal protected circuit pattern 414, carrier 202, and patterned dielectric layer 306, respectively.

Similarly, etch stop metal protected circuit pattern 414A, carrier 202A, and patterned dielectric layer 306A are sometimes referred to as lower, e.g., second, etch stop metal protected circuit pattern 414A, carrier 202A, and patterned dielectric layer 306A, respectively. Etch stop metal protected circuit pattern 414A, carrier 202A, and patterned dielectric layer 306A form a lower, e.g., second, etch stop metal protected circuit pattern carrier structure 718A having an interior surface 718I.

Dielectric layer 716 is glass impregnated resin, e.g., printed circuit board material, dielectric film, epoxy, or other dielectric material.

Generally, during dielectric lamination operation 114, upper etch stop metal protected circuit pattern carrier structure 718 is united with lower etch stop metal protected circuit pattern carrier structure 718A by dielectric layer 716.

In accordance with one embodiment, upper etch stop metal protected circuit pattern carrier structure 718, i.e., interior surface 718I, is placed on upper surface 716U of dielectric layer 716 and lower etch stop metal protected circuit pattern carrier structure 718A, i.e., interior surface 718I, is placed on lower surface 716L of dielectric layer 716. The assembly is heated while etch stop metal protected circuit pattern carrier structures 718, 718A are pressed into dielectric layer 716.

Due to the heat and pressure, dielectric layer 716 is caused to bond to etch stop metal protected circuit pattern carrier structures 718, 718A, i.e., to interior surfaces 718I thereof.

Figure 8:
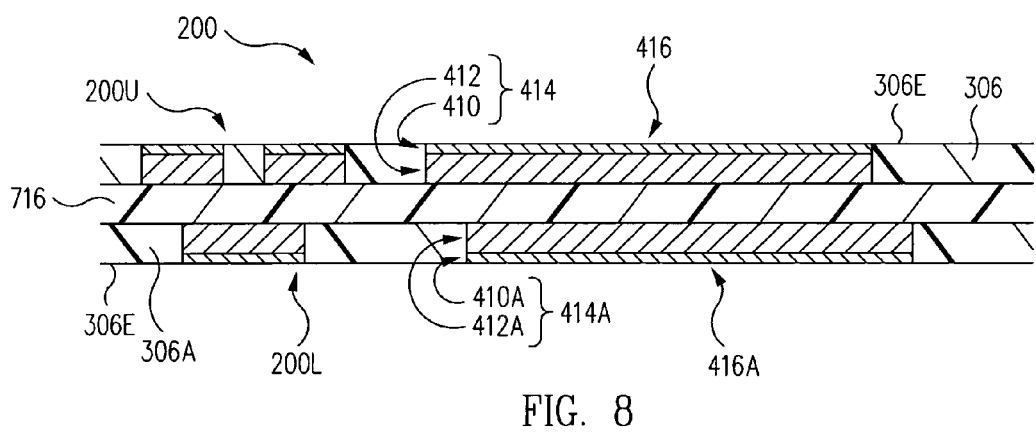

Referring now to FIGS. 1 and 8 together, from dielectric lamination operation 114, flow moves to a remove carriers operation 116. In remove carriers operation 116, carriers 202, 202A are removed.

As illustrated in FIG. 8, patterned etch stop layers 410, 410A, i.e., the exterior surfaces thereof, are substantially coplanar with exterior surfaces 306E of patterned dielectric layers 306, 306A and define upper and lower surface 200U, 200L of substrate 200, respectively.

Figure 9:
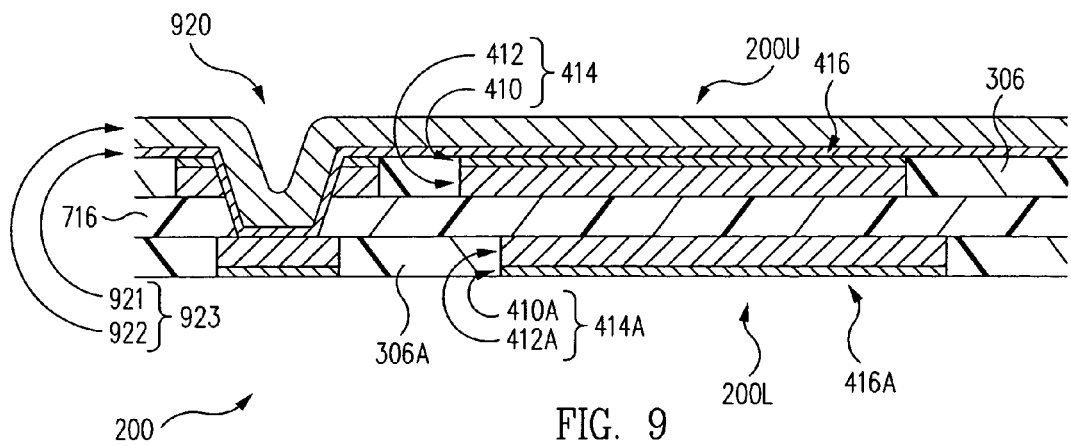
Figure 10:
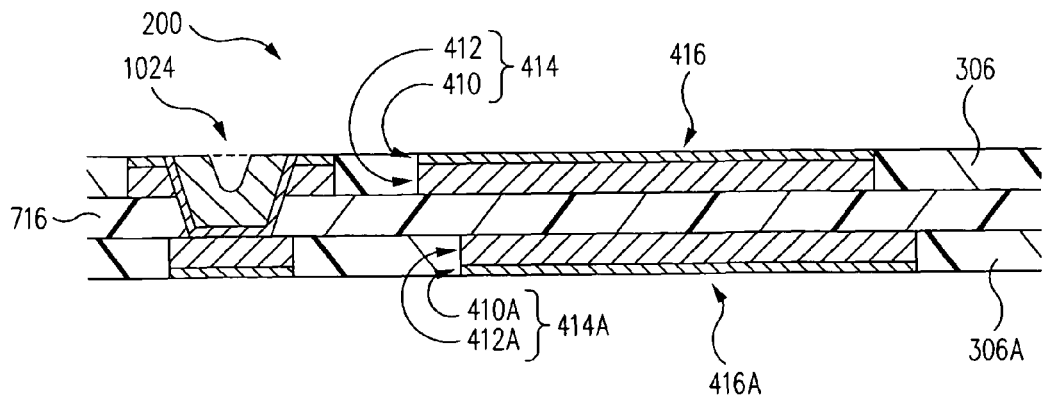

Referring now to FIGS. 1, 9 and 10 together, from remove carriers operation 116, flow moves to a laser-ablate via apertures operation 118. In laser-ablate via apertures operation 118, via apertures 920 are formed in substrate 200 using laser-ablation.

From laser-ablate via apertures operation 118, flow moves to a plate via apertures operation 120. In plate via apertures operation 120, via apertures 920 are plated, e.g., with copper or other conductive material.

In one embodiment, to plate via apertures 920, an electrically conductive seed layer 921 is formed within via apertures 920 and on upper surface 200U of substrate 200. In one embodiment, seed layer 921, e.g., copper, is plated using an electroless plating operation. Primary conductor layer 922 is formed on seed layer 921. Seed layer 921 and primary conductor layer 922 collectively form a bi-layer via conductor layer 923. Lower surface 200L is masked or otherwise protected to prevent formation of via conductor layer 923 on lower surface 200L. Alternatively, instead of removing carrier 202A (FIG. 7) as illustrated in FIG. 9, carrier 202A is used to plate via apertures 920 and is later removed.

After formation of via conductor layer 923, a copper etch process is performed to remove via conductor layer 923 except within via apertures 920, i.e., via conductor layer 923 is removed from upper surface 200U of substrate 200. During this copper etch process, patterned etch stop layers 410, 410A provide an etch stop for the copper etch process. Accordingly, after the copper etch process, electrically conductive vias 1024 remain within via apertures 920. Vias 1024 electrically connect patterned conductor layers 412, 412A through dielectric layer 716.

Figure 11:
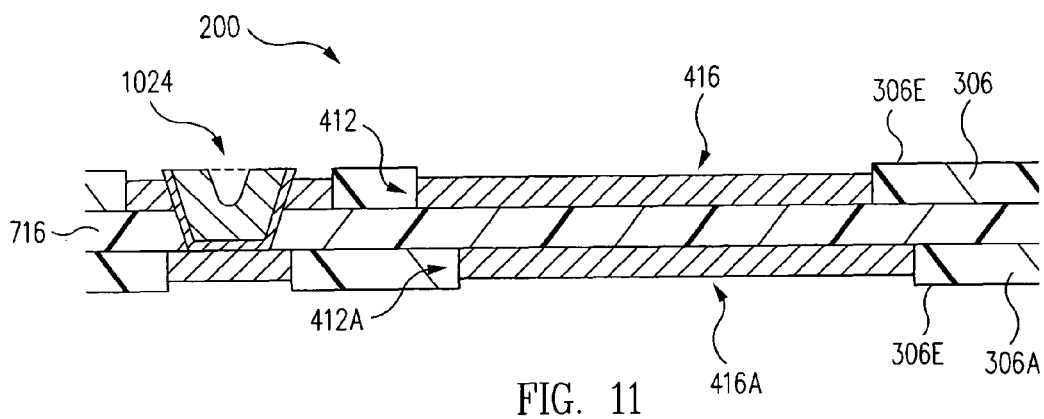
Figure 12:
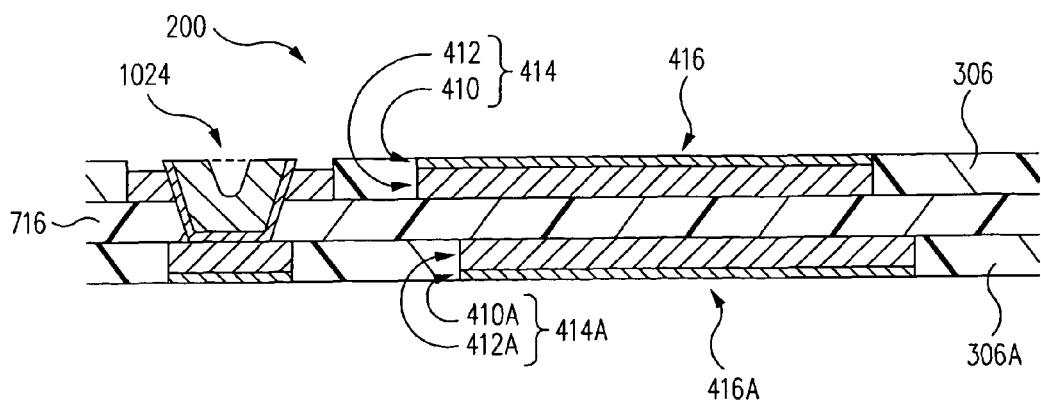

Referring now to FIGS. 1, 11, and 12 together, from plate via apertures operation 120, flow moves, optionally, to a blanket or selectively etch remove etch stop layer operation 122. In blanket or selectively etch remove etch stop layer operation 122, patterned etch stop layers 410, 410A are blanket removed, i.e., entirely and non-selectively removed, or selectively removed, i.e., partially removed.

FIG. 11 illustrates an embodiment where patterned etch stop layers 410, 410A are blanket removed, i.e., entirely and non-selectively removed. Accordingly, after blanket removal of patterned etch stop layers 410, 410A, patterned conductor layers 412, 412A remain within and are exposed from patterned dielectric layers 306, 306A, respectively. Patterned conductor layers 412, 412A are recessed within patterned dielectric layers 306, 306A, respectively. More particularly, patterned conductor layer 412 is recessed inwards of exterior surface 306E of patterned dielectric layer 306. Similarly, patterned conductor layer 412A is recessed inwards of exterior surface 306E of patterned dielectric layer 306A.

FIG. 12 illustrates an embodiment where patterned etch stop layers 410, and/or 410A are selectively removed, i.e., partially removed. Accordingly, after selective removal of patterned etch stop layers 410, and/or 410A, first portions of patterned conductor layers 412, and/or 412A are exposed from patterned dielectric layers 306, 306A while second portions of patterned conductor layers 412, and/or 412A remain covered within the remaining portions of etch stop layers 410, and/or 410A.

Figure 13:
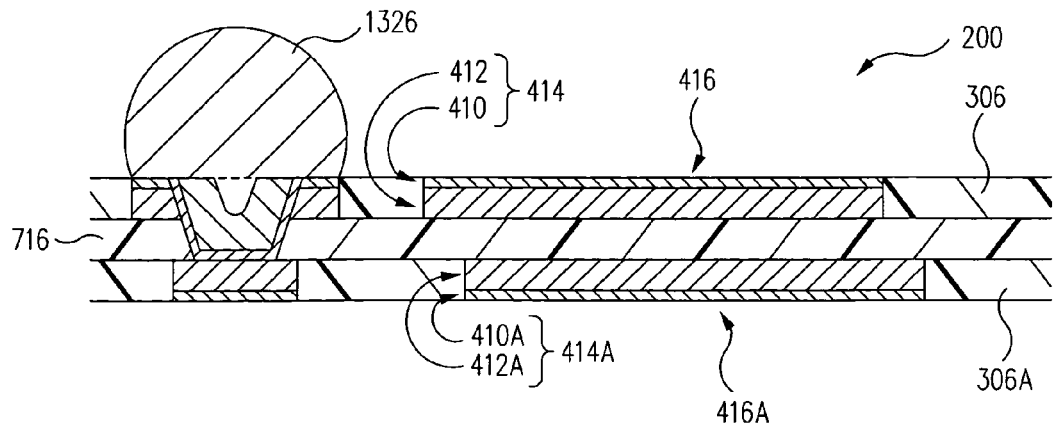

In accordance with the embodiment illustrated in FIG. 12, patterned etch stop layer 410 is removed from the portions of patterned conductor layer 412 where interconnection balls are to be formed as illustrated in FIG. 13.

From blanket or selectively etch remove etch stop layer operation 122 (or directly from plate via apertures operation 120 in the event that blanket or selectively etch remove etch stop layer operation 122 is not performed), flow moves optionally to a form interconnection balls operation 124. In form interconnection balls operation 124, interconnection balls 1326 (FIG. 13), e.g., solder balls, are formed.

Interconnection balls 1326 are formed using any one of a number of techniques well known to those skilled in the art and the particular technique used is not essential to this embodiment. Interconnection balls 1326 are used to electrically connect substrate 200 to other electrically conductive structures such as a larger substrate, e.g., a printed circuit motherboard, or other electronic components such as active and/or passive components.

From form interconnection balls operation 124 (or directly from operation 122 in the event that operation 124 is not performed or directly from operation 120 in the event that operations 122 and 124 are not performed), flow moves to and exits at an exit operation 126.

Figure 14:
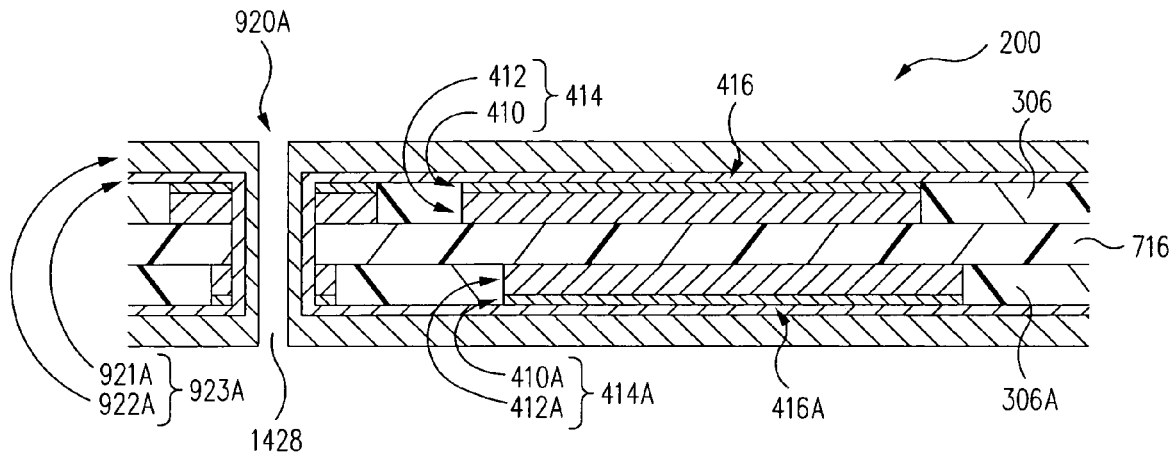
FIGS. 14 and 15 are cross-sectional views of the substrate of FIG. 8 at various stages during fabrication in accordance with another embodiment of the present invention.
Figure 15:
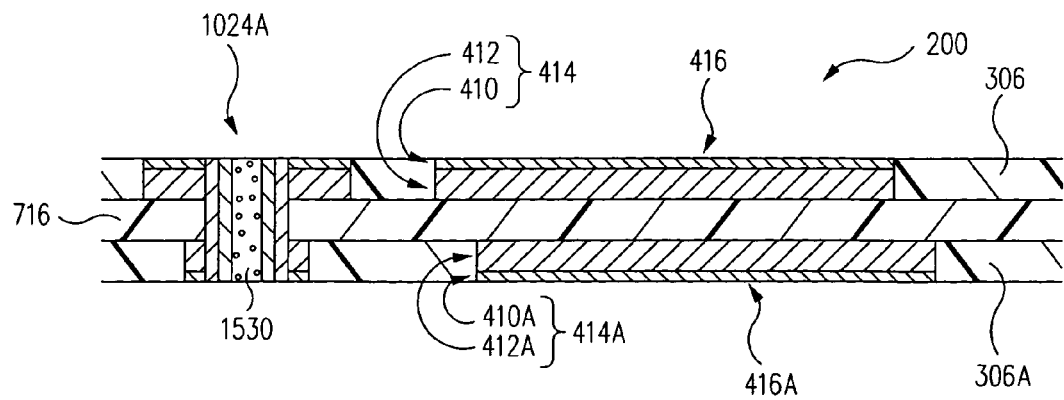

FIGS. 14 and 15 are cross-sectional views of substrate 200 of FIG. 8 at various stages during fabrication in accordance with another embodiment of the present invention. Referring now to FIGS. 1, 14 and 15 together, from remove carriers operation 116, in accordance with this embodiment, flow moves to drill via apertures operation 128 instead of laser-ablate via apertures operation 118. In drill via apertures operation 128, via apertures 920A are drilled through substrate 200, e.g., using a mechanical drill or otherwise.

From drill via apertures operation 128, flow moves to a fill via apertures operation 130. In fill via apertures operation 130, via apertures 920A are filled with an electrically conductive material to form electrically conductive vias 1024A.

In one embodiment, to fill via apertures 920A, an electrically conductive seed layer 921A is formed. Primary conductor layer 922A is formed on seed layer 921A. Seed layer 921A and primary conductor layer 922A collectively form a bi-layer via conductor layer 923A. Via conductor layer 923A only partially fills via apertures 920A such that spaces 1428 exist within via conductor layer 923A within via apertures 920A.

Spaces 1428 are filled with an epoxy 1530, e.g., an electrically conductive or non-conductive epoxy. Via conductor layer 923A is then etched, e.g., using a copper etch process. Accordingly, after the copper etch process, electrically conductive vias 1024A remain within via apertures 920A.

From fill via apertures operation 130, flow moves to blanket or selectively etch remove etch stop layer operation 122, which is optionally performed as discussed above.

Figure 16:
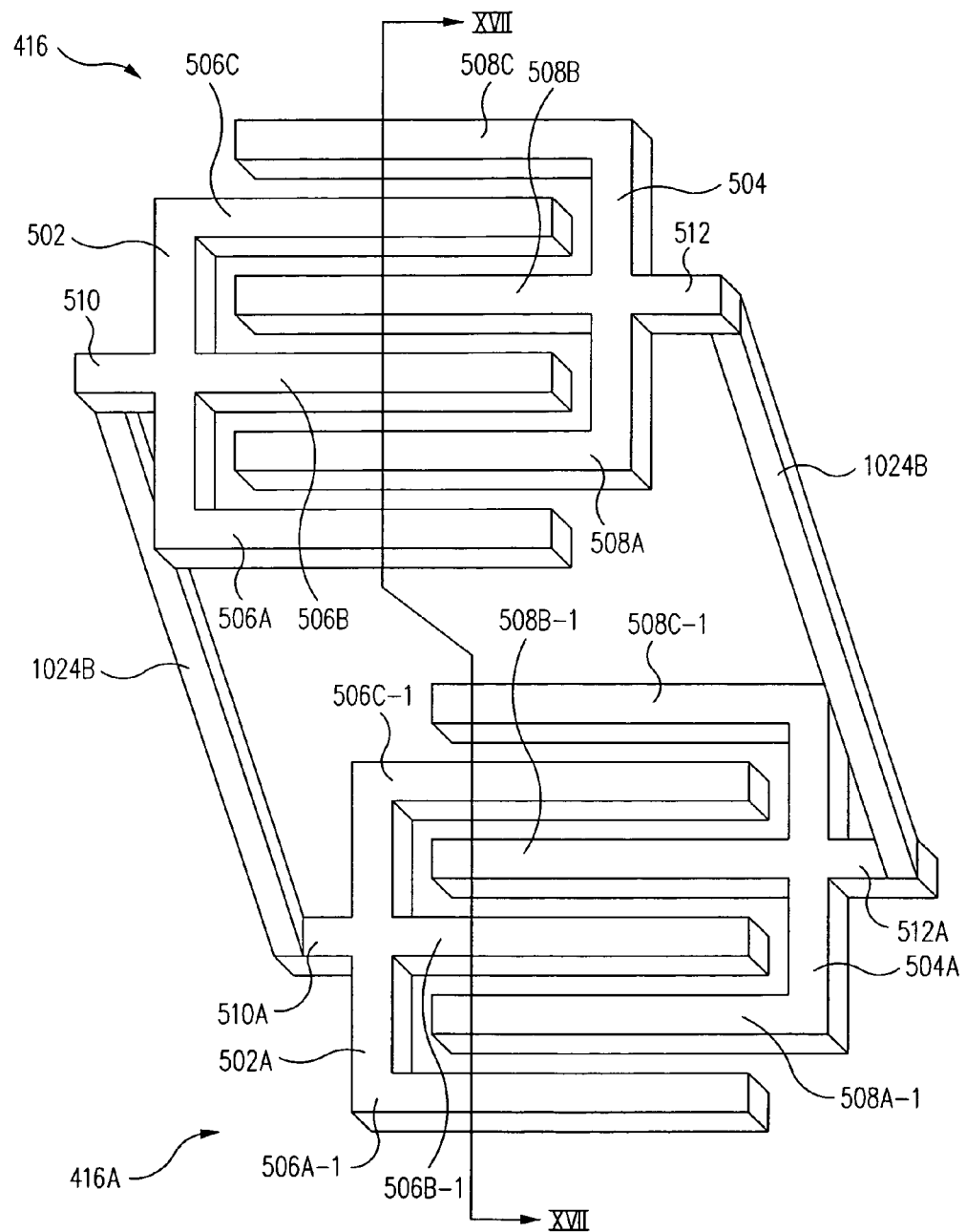
FIG. 16 is a perspective view of capacitors of FIG. 15 in accordance with one embodiment.
Figure 17:
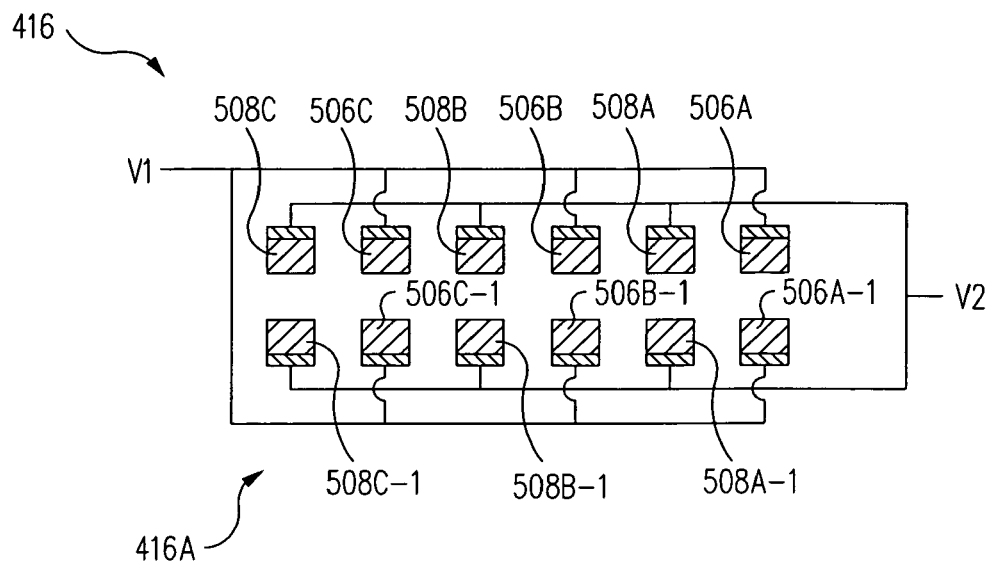
FIG. 17 is a cross-sectional view of the capacitors of FIG. 16 along the line XVII-XVII.
Figure 18:
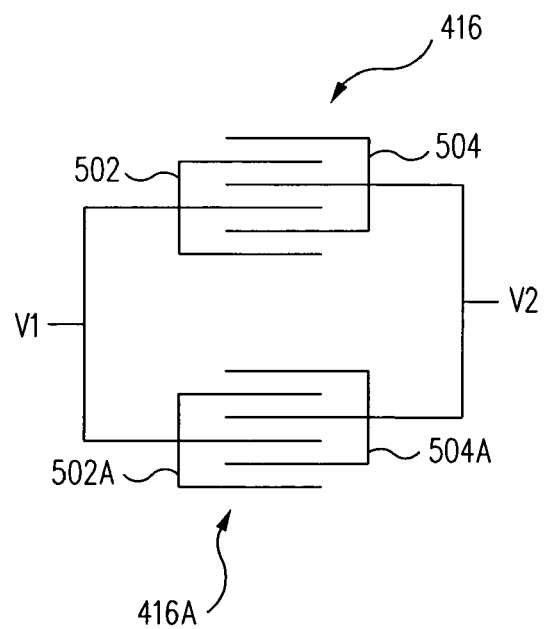
FIG. 18 is a schematic representation of the capacitors of FIG. 15 in accordance with one embodiment.

FIG. 16 is a perspective view of capacitors 416, 416A of FIG. 15 in accordance with one embodiment. FIG. 17 is a cross-sectional view of capacitors 416, 416A of FIG. 16 along the line XVII-XVII. FIG. 18 is a schematic representation of capacitors 416, 416A of FIG. 15 in accordance with one embodiment. For clarity of presentation, patterned dielectric layers 306, 306A and dielectric layer 716 are not illustrated in FIGS. 16, 17. Further, in FIG. 16, etch stop metal protected circuit patterns 414, 414A are illustrated as single conductor layers although it is to be understood that etch stop metal protected circuit patterns 414, 414A are bi-layer structure including patterned etch stop layers 410, 410A and patterned conductor layer 412, 412A as illustrated in FIGS. 15 and 17.

Referring now to FIGS. 15, 16, 17, and 18 together, as discussed above, capacitor 416 includes capacitor plates 502, 504 separated by patterned dielectric layer 306, which forms the dielectric material for capacitor 416. Similarly, capacitor 416A includes capacitor plates 502A, 504A separated by patterned dielectric layer 306A, which forms the dielectric material for capacitor 416A.

In accordance with this embodiment, capacitor plate 502A and capacitor plate 504A include fingers 506A-1, 506B-1, 506C-1, and fingers 508A-1, 508B-1, 508C-1, respectively. Fingers 506A-1, 506B-1, 506C-1, collectively fingers 506-1, are interdigitated with fingers 508A-1, 508B-1, 508C-1, collectively fingers 508-1. More particularly, in the horizontal, e.g., first, direction, finger 508A-1 is between fingers 506A-1, 506B-1, finger 506B-1 is between fingers 508A-1, 508B-1, finger 508B-1 is between fingers 506B-1, 506C-1, and finger 506C-1 is between fingers 508B-1, 508C-1.

Capacitor plates 502A, 504A are electrically connected to traces 510A, 512A of etch stop metal protected circuit pattern 414A. Trace 510 is electrically connected to trace 510A by an electrically conductive via 1024B. Although via 1024B is illustrated as a rectangular via, in another embodiment, via 1024B is similar to and formed in the same manner as via 1024 of FIG. 10 or via 1024A of FIG. 15. Similarly, trace 512 is electrically connected to trace 512A by an electrically conductive via 1024B.

In accordance with one embodiment, a first voltage V1 is applied to capacitor plates 502, 502A and a second voltage V2 is applied to capacitor plates 504, 504A. In accordance with this embodiment, capacitors 416, 416A represent two capacitors coupled in parallel.

Figure 19:
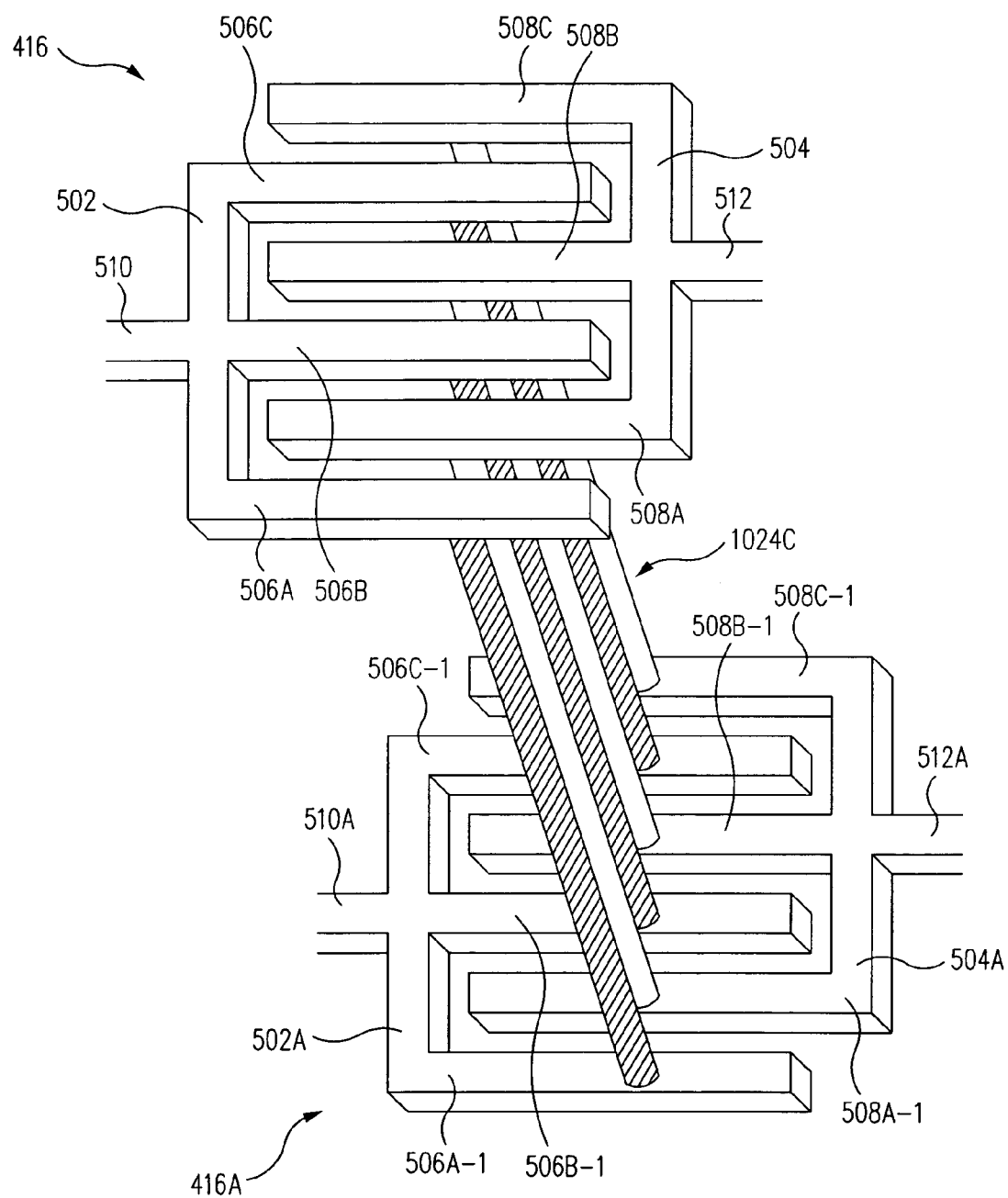
FIG. 19 is a perspective view of the capacitors of FIG. 15 in accordance with another embodiment.
Figure 20:
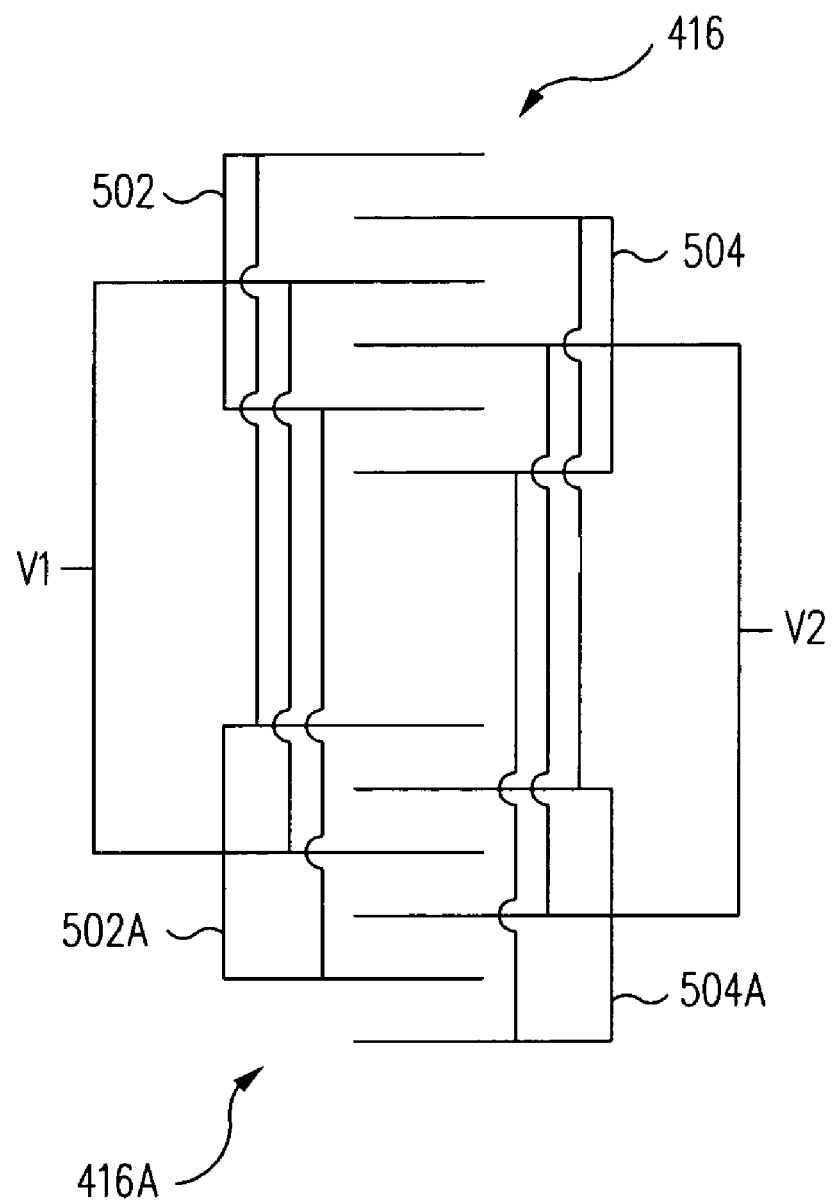
FIG. 20 is a schematic representation of the capacitors of FIG. 19 in accordance with one embodiment.

FIG. 19 is a perspective view of capacitors 416, 416A of FIG. 15 in accordance with another embodiment. FIG. 20 is a schematic representation of capacitors 416, 416A of FIG. 19 in accordance with one embodiment.

Referring now to FIGS. 19 and 20 together, in accordance with this embodiment, each respective finger of each respective capacitor plate of capacitors 416, 416A are directly electrically coupled to one another by vias 1024C. More particularly, fingers 506A, 506B, 506C of capacitor plate 502 of capacitor 416 are directly coupled to fingers 506A-1, 506B-1, 506C-1 of capacitor plate 502A of capacitor 416A by vias 1024C, respectively. Similarly, fingers 508A, 508B, 508C of capacitor plate 504 of capacitor 416 are directly coupled to fingers 508A-1, 508B-1, 508C-1 of capacitor plate 504A of capacitor 416A by vias 1024C, respectively. Although each respective finger of each respective capacitor plate of capacitors 416, 416A are directly electrically coupled to one another by single vias 1024C, in other embodiments, more than one via 1024C is used to couple each respective finger to one another.

Figure 21:
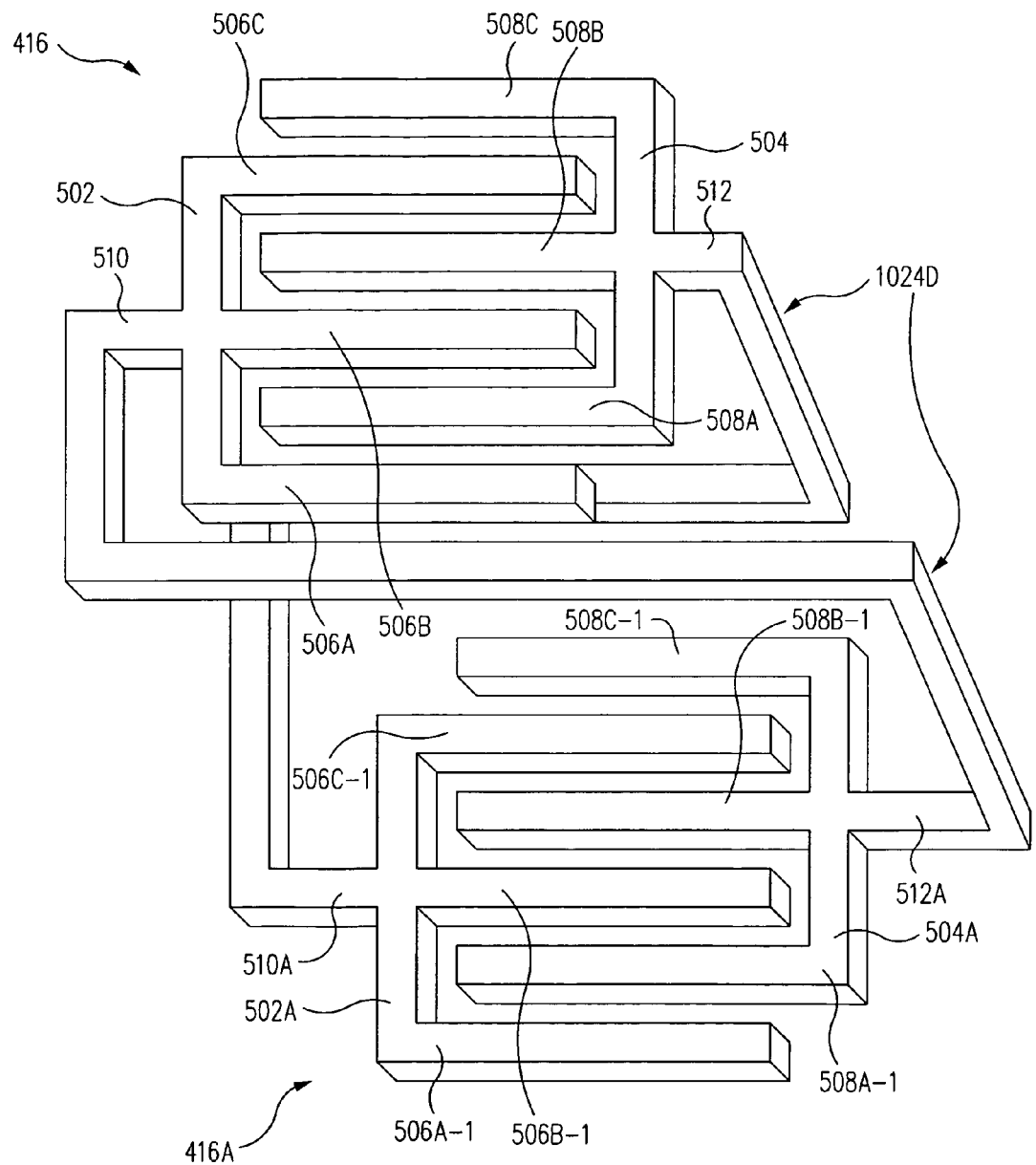
FIG. 21 is a perspective view of the capacitors of FIG. 15 in accordance with another embodiment.
Figure 22:
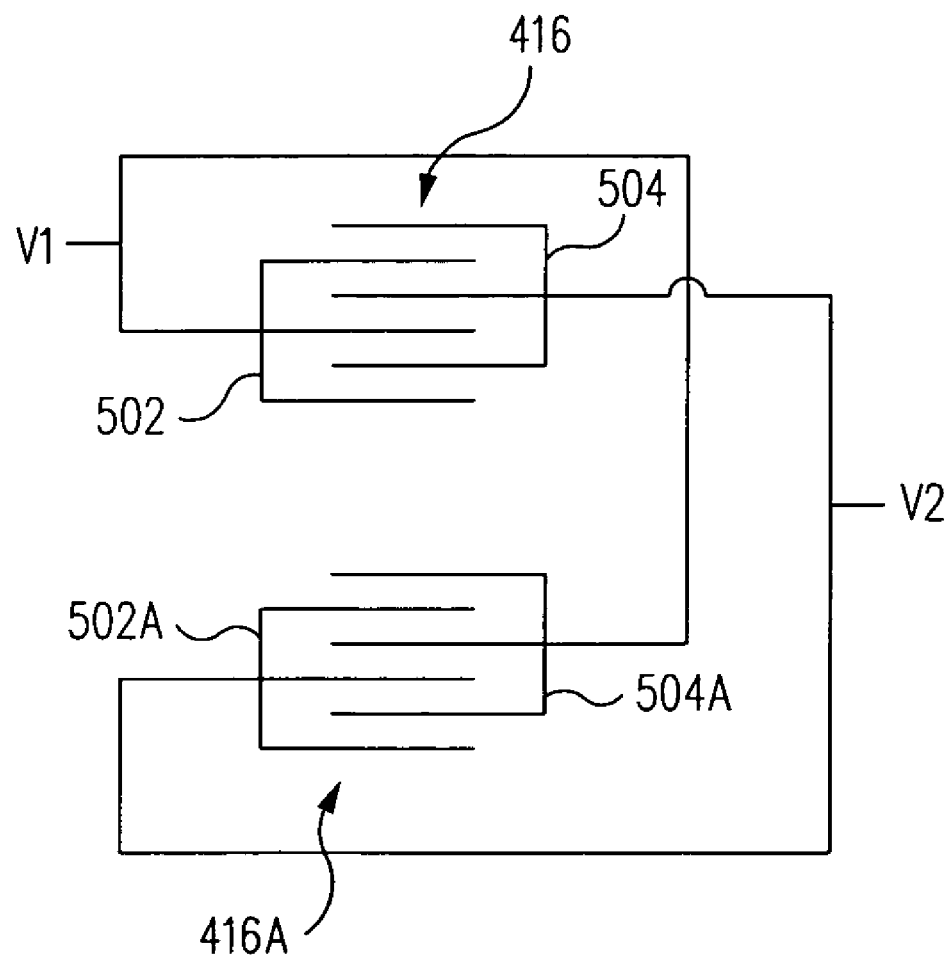
FIG. 22 is a schematic representation of the capacitors of FIG. 21 in accordance with one embodiment.

FIG. 21 is a perspective view of capacitors 416, 416A of FIG. 15 in accordance with another embodiment. FIG. 22 is a schematic representation of capacitors 416, 416A of FIG. 21 in accordance with one embodiment.

Referring now to FIGS. 21 and 22 together, in accordance with this embodiment, capacitor plate 502 of capacitor 416 is electrically coupled to capacitor plate 504A of capacitor 416A by an electrically conductive via 1024D. Similarly, capacitor plate 504 of capacitor 416 is electrically coupled to capacitor plate 502A of capacitor 416A by an electrically conductive via 1024D.

More particularly, trace 510 is electrically connected to trace 512A by a via 1024D. Similarly, trace 512 is electrically connected to trace 510A by via 1024D.

Although method 100 is described herein as forming structures having two patterned conductor layers 412, 412A, operations of method 100 can be repeated to form a structure having more than two patterned conductor layers, e.g., a multi-level metal structure.

Figure 23:
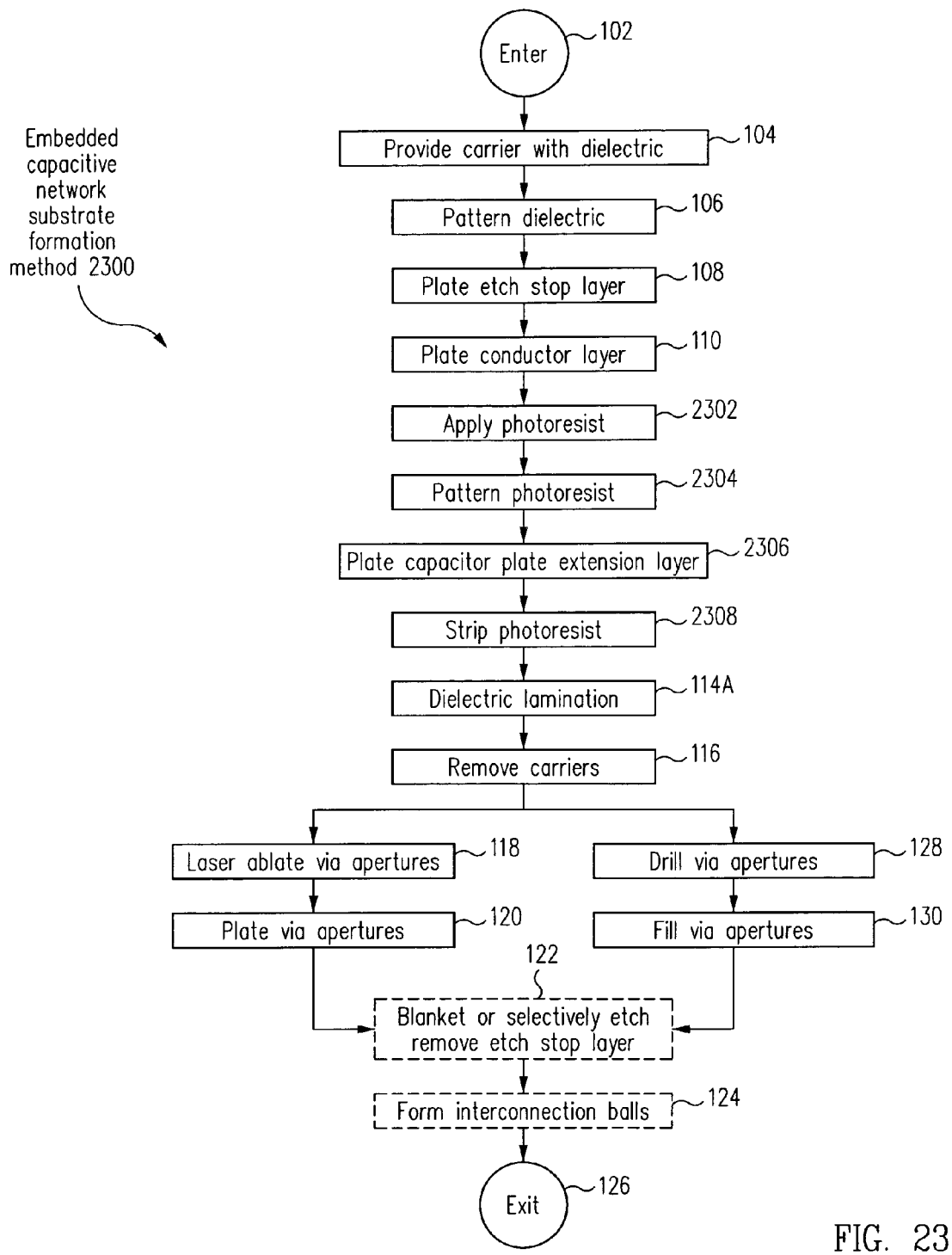
FIG. 23 is an embedded capacitive network substrate formation method for fabricating an embedded capacitive network substrate in accordance with another embodiment of the present invention.
Figure 24:
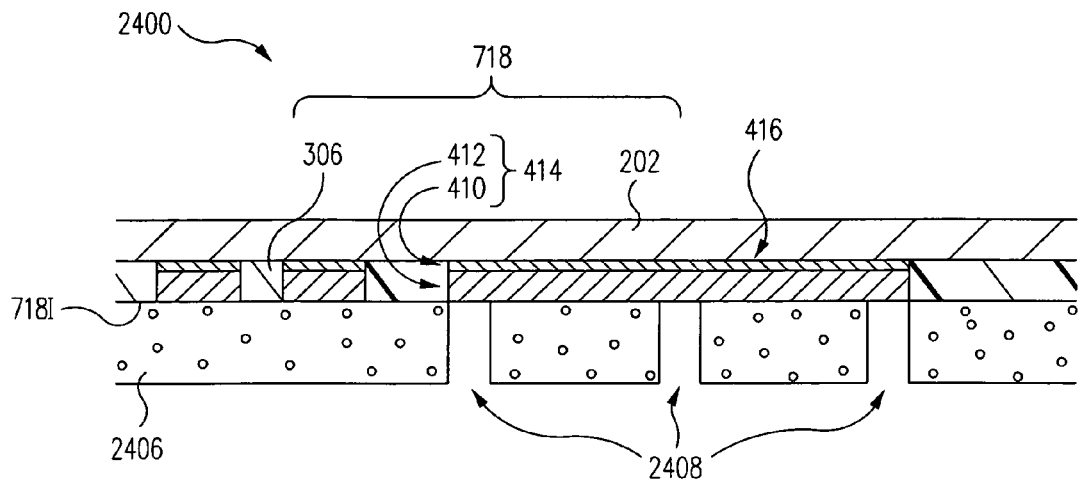
FIG. 24 is a cross-sectional view of an embedded capacitive network substrate during fabrication in accordance with one embodiment.

FIG. 23 is an embedded capacitive network substrate formation method 2300 for fabricating an embedded capacitive network substrate in accordance with another embodiment of the present invention. FIG. 24 is a cross-sectional view of an embedded capacitive network substrate 2400 during fabrication in accordance with one embodiment.

Operations 102, 104, 106, 108, 110, 114A, 116, 118, 120, 122, 124, 126, 128, 130 of embedded capacitive network substrate formation method 2300 of FIG. 23 are similar or identical to operations 102, 104, 106, 108, 110, 114, 116, 118, 120, 122, 124, 126, 128, 130 of embedded capacitive network substrate formation method 100 of FIG. 1, respectively, and so are not repeated here.

Referring now to FIGS. 23 and 24 together, from plate conductor layer operation 110, flow moves to an apply photoresist operation 2302. In apply photoresist operation 2302, a photoresist layer is applied to etch stop metal protected circuit pattern 414 and patterned dielectric layer 306. More particularly, the photoresist layer is applied to interior planar surface 7181 of etch stop metal protected circuit pattern carrier structure 718. Recall that etch stop metal protected circuit pattern 414, carrier 202, and patterned dielectric layer 306 form etch stop metal protected circuit pattern carrier structure 718.

From apply photoresist operation 2302, flow moves to a pattern photoresist operation 2304. In pattern photoresist operation 2304, the photoresist layer applied in apply photoresist operation 2302 is patterned to form a patterned photoresist layer 2406 as illustrated in FIG. 24. The photoresist layer is patterned using laser-ablation in one embodiment. In another embodiment, a photolithography process is used including use of laser direct imaging.

The photoresist layer is patterned to expose portions of etch stop metal protected circuit pattern 414. More particularly, the photoresist layer is patterned to form capacitor plate extension artifacts 2408, i.e., openings, within the photoresist layer. Stated another way, patterned photoresist layer 2406 includes capacitor plate extension artifacts 2408. Capacitor 416, i.e., a portion of etch stop metal protected circuit pattern 414, is exposed through capacitor plate extension artifacts 2408. More particularly, capacitor plates 502, 504 (illustrated in FIG. 26) of capacitor 416 are exposed through capacitor plate extension artifacts 2408.

Figure 25:
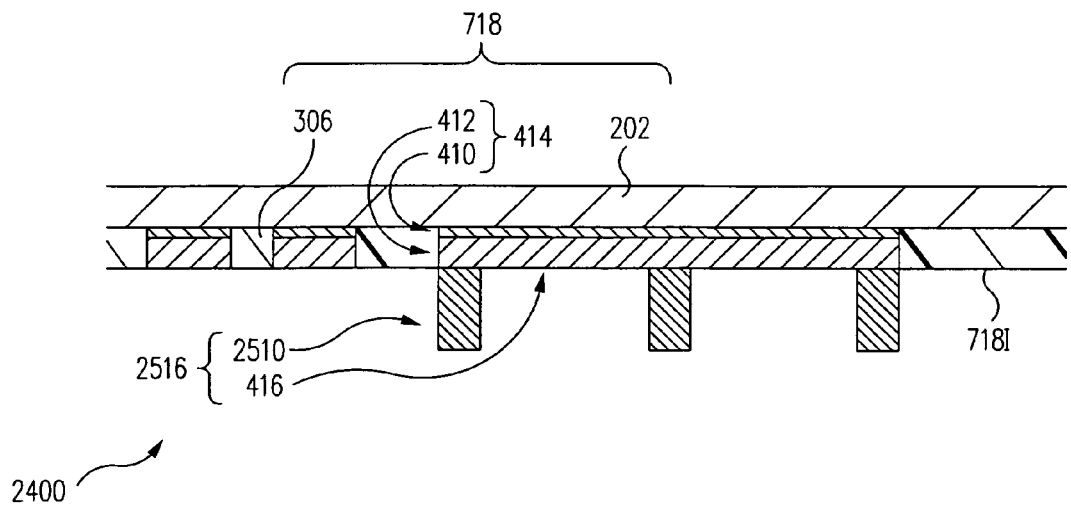
FIG. 25 is a cross-sectional view of the substrate of FIG. 24 at a further stage of fabrication in accordance with one embodiment of the present invention.

FIG. 25 is a cross-sectional view of substrate 2400 of FIG. 24 at a further stage of fabrication in accordance with one embodiment of the present invention. Referring now to FIGS. 23 and 25 together, from pattern photoresist operation 2304, flow moves to a plate capacitor plate extension layer operation 2306. In plate capacitor plate extension layer operation 2306, a patterned capacitor plate extension layer 2510 of a conductive material, e.g., copper, is plated within capacitor plate extension artifacts 2408 of patterned photoresist layer 2406. Stated another way, capacitor plate extension artifacts 2408 of patterned photoresist layer 2406 are filled with a conductive material to form patterned capacitor plate extension layer 2510.

From plate capacitor plate extension layer operation 2306, flow moves to a strip photoresist operation 2308. In strip photoresist operation 2308, patterned photoresist layer 2406 is stripped, i.e., removed. Patterned photoresist layer 2406 is stripped using any one of a number of photoresist stripping techniques well known to those of skill in the art, the particular technique used is not essential to this embodiment.

Thus, as shown in FIG. 25, after removal of patterned photoresist layer 2406, patterned capacitor plate extension layer 2510 remains on and protrudes from interior planar surface 7181 of etch stop metal protected circuit pattern carrier structure 718. Generally, patterned capacitor plate extension layer 2510 remains on and protrudes from etch stop metal protected circuit pattern 414, i.e., from capacitor 416. Patterned capacitor plate extension layer 2510 and capacitor 416 form an extended plate capacitor 2516.

Figure 26:
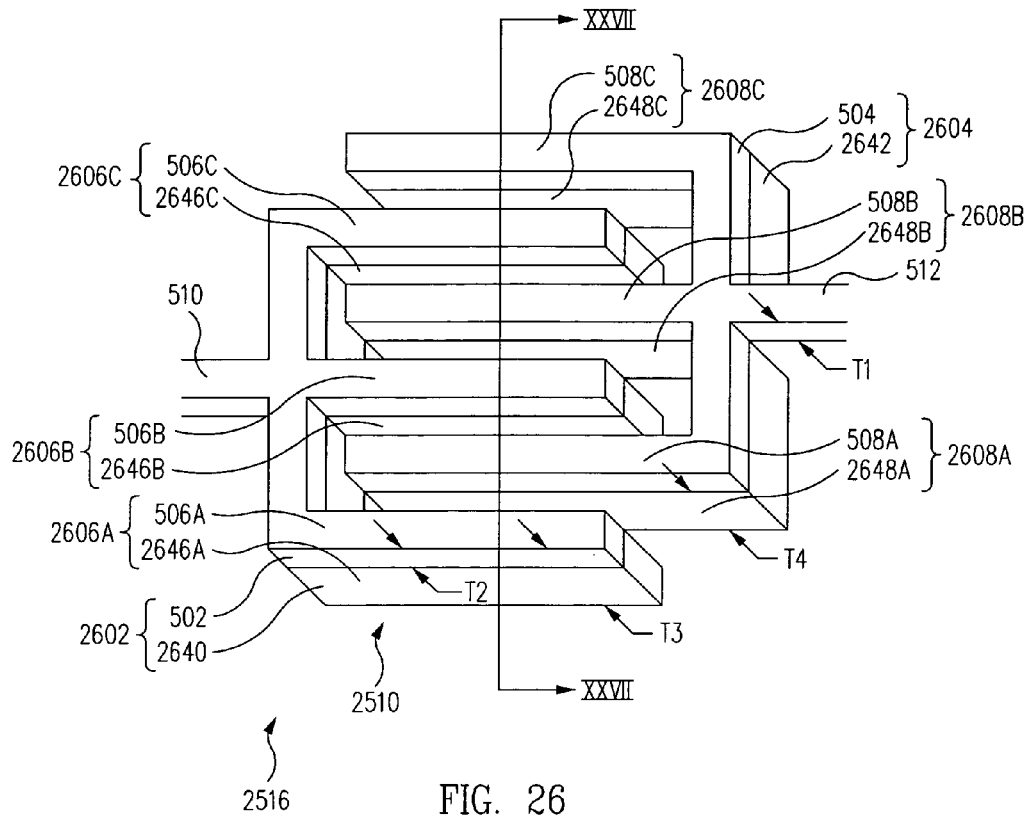
FIG. 26 is a perspective view of an extended plate capacitor of FIG. 25 in accordance with one embodiment.
Figure 27:
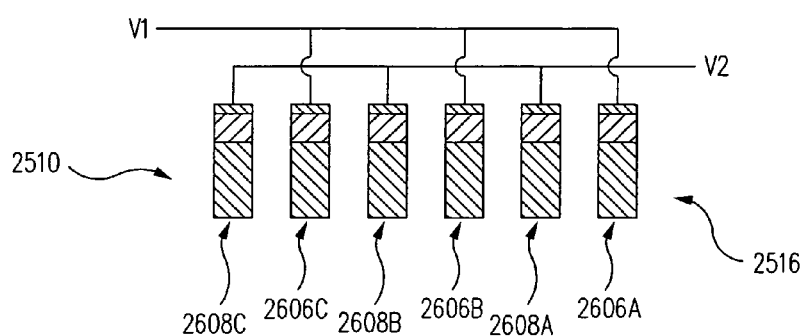
FIG. 27 is a cross-sectional view of the extended plate capacitor of FIG. 26 along the line XXVII-XXVII.

FIG. 26 is a perspective view of extended plate capacitor 2516 of FIG. 25 in accordance with one embodiment. FIG. 27 is a cross-sectional view of extended plate capacitor 2516 of FIG. 26 along the line XXVII-XXVII.

Referring now to FIGS. 26 and 27 together, extended plate capacitor 2516 includes capacitor plates 502, 504 separated by patterned dielectric layer 306. Further, extended plate capacitor 2516 also includes patterned capacitor plate extension layer 2510 formed on capacitor plates 502, 504. Capacitor plates 502, 504 and patterned capacitor plate extension layer 2510 collectively form extended capacitor plates 2602, 2604, respectively.

More particularly, extended capacitor plate 2602 includes capacitor plate 502, i.e., a first capacitor plate, and a first capacitor plate extension 2640, i.e., a portion of patterned capacitor plate extension layer 2510. Similarly, extended capacitor plate 2604 includes capacitor plate 504, i.e., a second capacitor plate, and a second capacitor plate extension 2642, i.e., a portion of patterned capacitor plate extension layer 2510.

A thickness T1 of traces 510, 512 in the vertical direction is less than a thickness T3 of extended capacitor plates 2602, 2604. More particularly, thickness T3 of extended capacitor plates 2602, 2604 equals thickness T2 of capacitor plates 502, 504 plus thickness T4 of capacitor plate extensions 2640, 2642.

Extended capacitor plates 2602, 2604 of extended plate capacitor 2516 include extended fingers 2606A, 2606B, 2606C, and extended fingers 2608A, 2608B, 2608C, respectively. Extended fingers 2606A, 2606B, 2606C are formed by fingers 506A, 506B, 506C and finger extensions 2646A, 2646B, 2646C, i.e., portions of first capacitor plate extension 2640. Similarly, extended fingers 2608A, 2608B, 2608C are formed by fingers 508A, 508B, 508C and finger extensions 2648A, 2648B, 2648C, i.e., portions of second capacitor plate extension 2642.

Extended fingers 2606A, 2606B, 2606C, collectively extended fingers 2606, are interdigitated with extended fingers 2608A, 2608B, 2608C, collectively extended fingers 2608. More particularly, in the horizontal direction, extended finger 2608A is between extended fingers 2606A, 2606B, extended finger 2606B is between extended fingers 2608A, 2608B, extended finger 2608B is between extended fingers 2606B, 2606C, and extended finger 2606C is between extended fingers 2608B, 2608C.

From strip photoresist operation 2308, flow moves to a dielectric lamination operation 114A. In dielectric lamination operation 114A, etch stop metal protected circuit patterns 414, 414A are laminated to an intermediary dielectric layer 716 in a manner similar to that discussed above regarding FIG. 7. However, in accordance with this embodiment, patterned capacitor plate extension layer 2510 (finger extensions 2646, 2648) is embedded within dielectric layer 716 during dielectric lamination operation 114A.

Operations 116, 118, 120, 122, 124, 126, 128, 130 and/or combinations thereof are performed as discussed above.

In light of this disclosure, those of skill in the art will understand that etch stop metal protected circuit pattern carrier structure 718A (see FIG. 7) can be formed with capacitor 416A as illustrated in FIG. 7 and/or with an extended plate capacitor similar to extended plate capacitor 2516 by forming a patterned capacitor plate extension layer similar to patterned capacitor plate extension layer 2510 on capacitor 416A.

Although extended plate capacitor 2516 is set forth as including extended capacitor plates 2602, 2604 which are formed in the same metal level as illustrated in FIG. 27, in another embodiment, an extended plate capacitor is formed with extended capacitor plates which are in different metal levels from one another as discussed in greater detail below with reference to FIGS. 28, 29, 30, 31, and 32.

Figure 28:
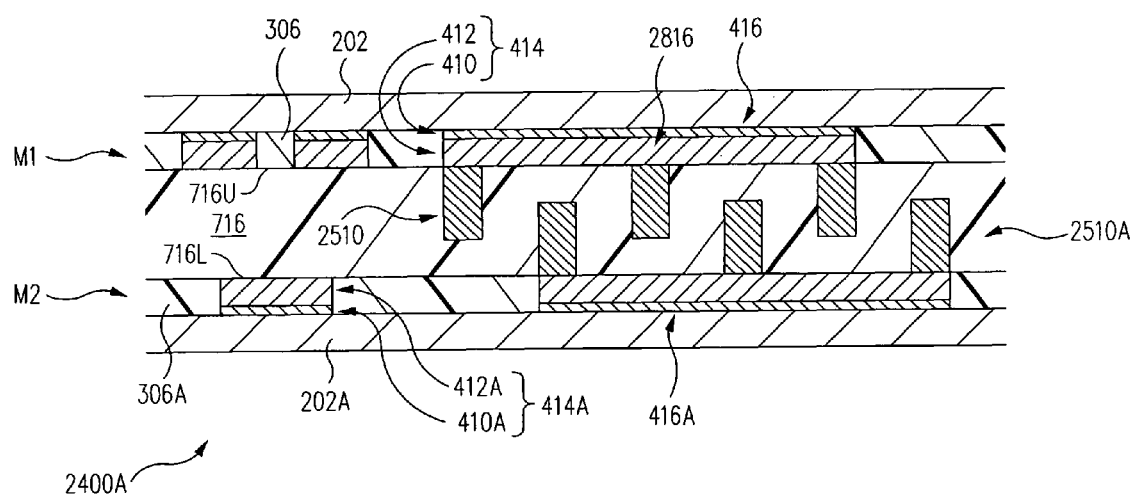
FIG. 28 is a cross-sectional view of an embedded capacitive network substrate including a multi-level extended plate capacitor during fabrication in accordance with another embodiment.
Figure 29:
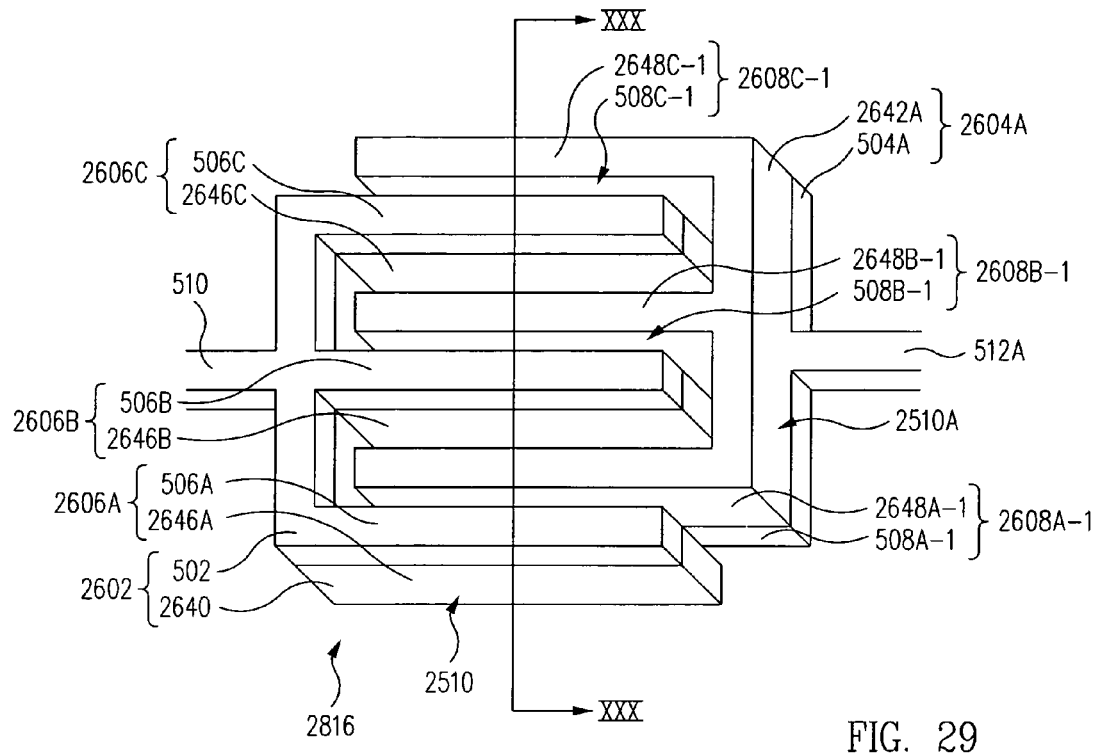
FIG. 29 is a perspective view of the multi-level extended plate capacitor of FIG. 28 in accordance with one embodiment.
Figure 30:
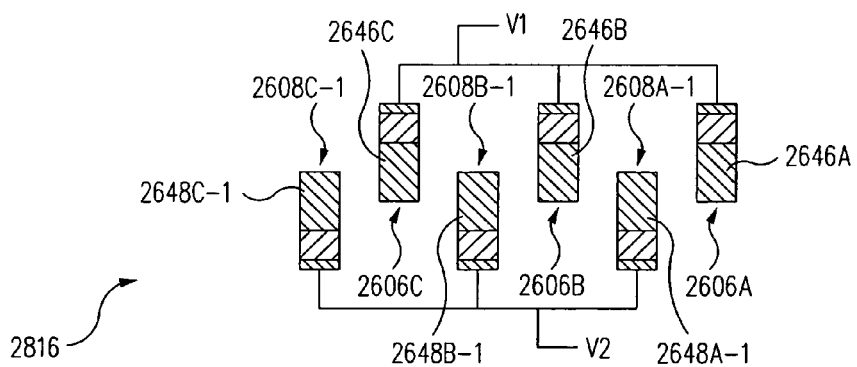
FIG. 30 is a cross-sectional view of the multi-level extended plate capacitor of FIG. 29 along the line XXX-XXX.

FIG. 28 is a cross-sectional view of an embedded capacitive network substrate 2400A including a multi-level extended plate capacitor 2816 during fabrication in accordance with another embodiment. FIG. 29 is a perspective view of multi-level extended plate capacitor 2816 of FIG. 28 in accordance with one embodiment. FIG. 30 is a cross-sectional view of multi-level extended plate capacitor 2816 of FIG. 29 along the line XXX-XXX.

Referring now to FIGS. 28, 29, and 30 together, multi-level extended plate capacitor 2816 includes extended capacitor plate 2602 in a first metal level M1. Extended capacitor plate 2602 is discussed in detail above in regards to FIGS. 25, 26, 27 and so the discussion is not repeated here.

Multi-level extended plate capacitor 2816 further includes an extended capacitor plate 2604A in a second metal level M2. Extended capacitor plate 2604A includes capacitor plate 504A and a second capacitor plate extension 2642A, i.e., a portion of a patterned capacitor plate extension layer 2510A. Capacitor plate extension 2640 extends downwards and is embedded into upper surface 716U of dielectric layer 716 whereas capacitor plate extension 2642A extends upwards and is embedded into lower surface 716L of dielectric layer 716.

Extended capacitor plate 2604A of multi-level extended plate capacitor 2816 includes extended fingers 2608A-1, 2608B-1, 2608C-1, respectively. Extended fingers 2608A-1, 2608B-1, 2608C-1 are formed by fingers 508A-1, 508B-1, 508C-1 and finger extensions 2648A-1, 2648B-1, 2648C-1, i.e., portions of second capacitor plate extension 2642A.

Extended fingers 2606A, 2606B, 2606C are interdigitated with extended fingers 2608A-1, 2608B-1, 2608C-1, collectively extended fingers 2608-1. More particularly, in the horizontal direction, extended finger 2608A-1 is between extended fingers 2606A, 2606B, extended finger 2606B is between extended fingers 2608A-1, 2608B-1, extended finger 2608B-1 is between extended fingers 2606B, 2606C, and extended finger 2606C is between extended fingers 2608B-1, 2608C-1.

Specifically, finger extensions 2646A, 2646B, 2646C, collectively finger extensions 2646, are interdigitated with finger extensions 2648A-1, 2648B-1, 2648C-1, collectively finger extensions 2648-1. More particularly, in the horizontal direction, finger extensions 2648A-1 is between finger extensions 2646A, 2646B, finger extensions 2646B is between finger extensions 2648A-1, 2648B-1, finger extensions 2648B-1 is between finger extensions 2646B, 2646C, and finger extensions 2646C is between finger extensions 2648B-1, 2648C-1.

Extended capacitor plate 2602 is electrically connected to trace 510 and to a first voltage source so has an applied voltage V1 whereas extended capacitor plate 2604A is electrically connected to a trace 512A and to a second voltage source and so has an applied voltage V2.

Dielectric layer 716 provides the dielectric material for multi-level extended plate capacitor 2816 between extended capacitor plates 2602, 2604A. A thickness of dielectric layer 716 is selected to provide a desired capacitance for multi-level extended plate capacitor 2816.

Figure 31:
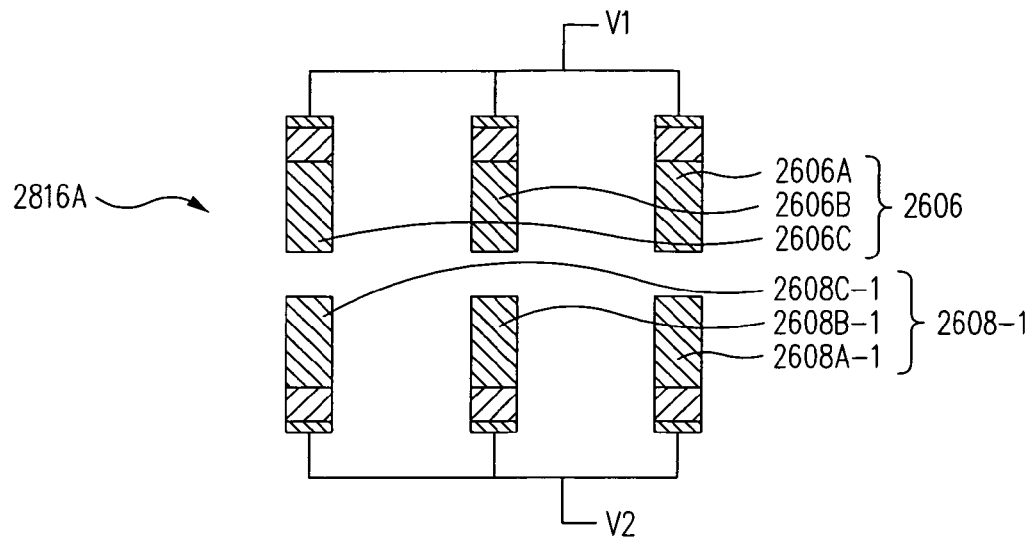
FIG. 31 is a cross-sectional view of a multi-level extended plate capacitor in accordance with another embodiment.
Figure 32:
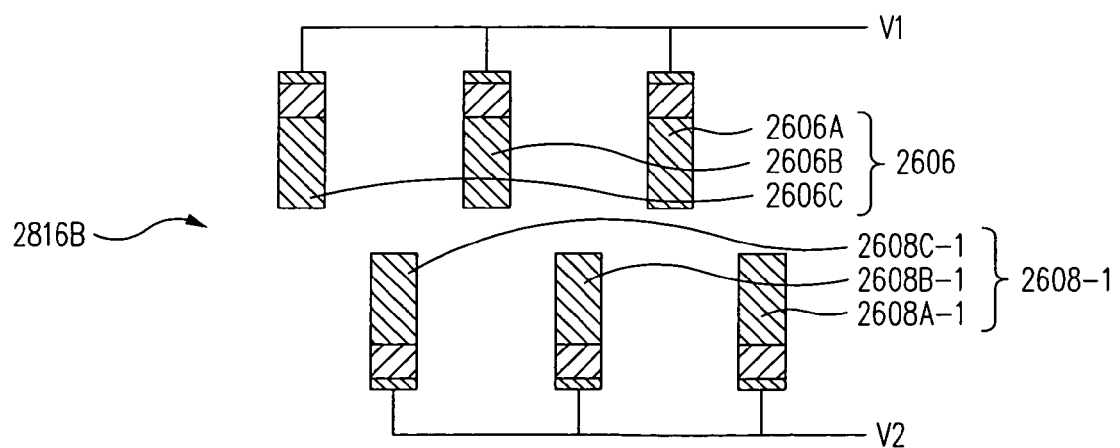
FIG. 32 is a cross-sectional view of a multi-level extended plate capacitor in accordance with another embodiment.

Although extended fingers 2606 are set forth as interdigitated and horizontally overlapping with extended fingers 2608-1, in other embodiments, extended fingers 2606 have other positional relationships with respect extended fingers 2608-1 as set forth in FIGS. 31 and 32 as examples.

FIG. 31 is a cross-sectional view of a multi-level extended plate capacitor 2816A in accordance with yet another embodiment. As illustrated in FIG. 31, extended fingers 2606 vertically but not horizontally overlap with extended fingers 2608-1. Stated another way, extended fingers 2606 are vertically aligned with extended fingers 2608-1, a small space existing between extended fingers 2606, 2608-1.

FIG. 32 is a cross-sectional view of a multi-level extended plate capacitor 2816B in accordance with another embodiment. As illustrated in FIG. 32, extended fingers 2606 do not horizontally overlap with extended fingers 2608-1, but are vertically centered with extended fingers 2608-1.

Figure 33:
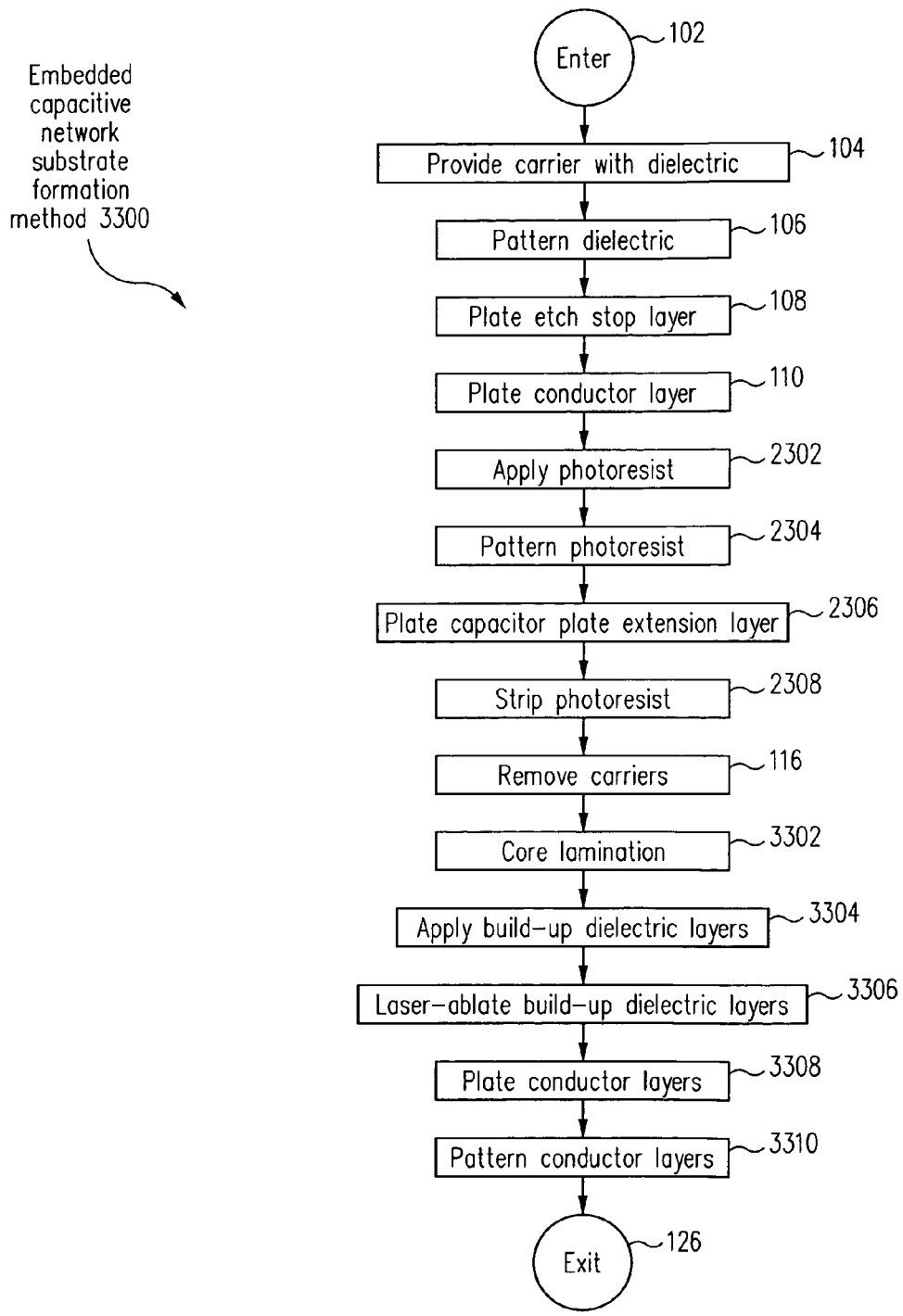
FIG. 33 is an embedded capacitive network substrate formation method for fabricating an embedded capacitive network substrate in accordance with one embodiment of the present invention.
Figure 34:
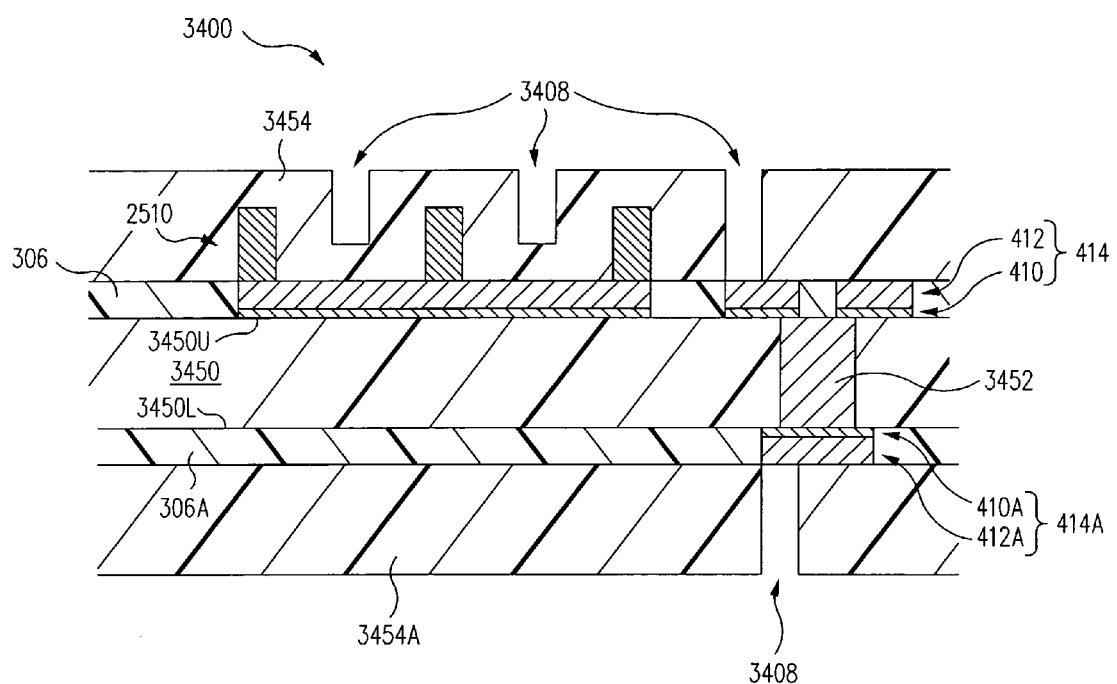
FIG. 34 is a cross-sectional view of an embedded capacitive network substrate during fabrication in accordance with one embodiment.

FIG. 33 is an embedded capacitive network substrate formation method 3300 for fabricating an embedded capacitive network substrate in accordance with one embodiment of the present invention. FIG. 34 is a cross-sectional view of an embedded capacitive network substrate 3400 during fabrication in accordance with one embodiment.

Operations 102, 104, 106, 108, 110, 2302, 2304, 2306, 2308, 116, 126 of embedded capacitive network substrate formation method 3300 of FIG. 33 are similar or identical to operations 102, 104, 106, 108, 110, 2302, 2304, 2306, 2308, 116, 126 of embedded capacitive network substrate formation method 2300 of FIG. 23, respectively, and so are not repeated here.

Referring now to FIGS. 33 and 34 together, from remove carriers operation 116, flow moves to a core lamination operation 3302. In core lamination operation 3302, patterned dielectric layer 306 including etch stop metal protected circuit pattern 414 are laminated to an upper, e.g., first, surface 3450U of a core 3450 such that patterned capacitor plate extension layer 2510 extends upwards and away from core 3450. Core 3450 includes vias 3452 or other electrically conductive structures that are electrically connected to etch stop metal protected circuit pattern 414. Although etch stop metal protected circuit pattern 414 is set forth, in other embodiments, a single layer circuit pattern, e.g., copper, is used instead of etch stop metal protected circuit pattern 414.

Further, a lower etch stop metal protected circuit pattern 414A and patterned dielectric layer 306A are also laminated to a lower, e.g., second, surface, 3450L of core 3450. Core 3450 is any standard core material, e.g., printed circuit board material, laminate, ceramic, tape or other core material.

From core lamination operation 3302, flow moves to an apply build-up dielectric layers operation 3304. In apply build-up dielectric layers operation 3304, upper and lower, e.g., first and second, build-up dielectric layers, e.g., Ajinomoto build up film (ABF) layers, are applied to substrate 3400. The upper build-up dielectric layer covers patterned capacitor plate extension layer 2510.

From apply build-up dielectric layers operation 3304, flow moves to a laser-ablate build-up dielectric layers operation 3306. In laser-ablate build-up dielectric layers operation 3306, the upper and lower build-up dielectric layer are patterned to form patterned build-up dielectric layers 3454, 3454A as illustrated in FIG. 34. The upper and lower build-up dielectric layers are patterned using laser-ablation in accordance with this embodiment.

More particularly, build-up dielectric layers 3454, 3454A include circuit pattern artifacts 3408. Illustratively, circuit pattern artifacts 3408 include trace channels, land apertures, via apertures and capacitor plate apertures in which traces, lands, vias and capacitor plates are formed as discussed below. A trace channel, land aperture, and capacitor plate aperture is suspended within build-up dielectric layers 3454, 3454A, i.e., only extends partially and not entirely through build-up dielectric layers 3454, 3454A. In contrast, a via aperture extends completely through build-up dielectric layers 3454, 3454A to a conductive feature of etch stop metal protected circuit patterns 414, 414A, respectively.

From laser-ablate build-up dielectric layers operation 3306, flow moves to a plate conductor layers operation 3308. In plate conductor layers operation 3308, circuit pattern artifacts 3408 are filled with electrically conductive material, e.g., a single conductor layer or a bilayer conductor layer comprising a seed layer and a primary conductor layer. Generally, an upper, e.g., first, conductor layer is plated on build-up dielectric layer 3454 and a lower, e.g., second, conductor layer is plated on build-up dielectric layer 3454A. The plating process overplates build-up dielectric layers 3454, 3454A such that the exterior surfaces are covered.

Figure 35:
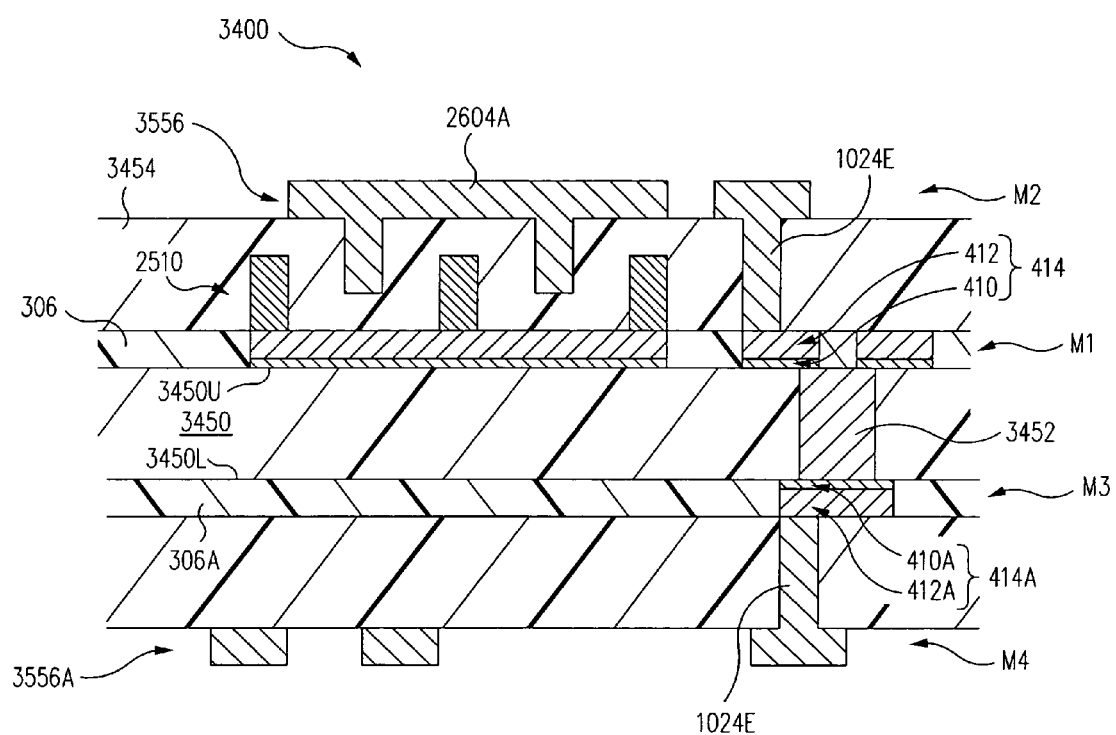
FIG. 35 is a cross-sectional view of the substrate of FIG. 34 at a further stage in fabrication in accordance with one embodiment.

From plate conductor layers operation 3308, flow moves to a pattern conductor layers operation 3310. In pattern conductor layers operation 3310, the conductor layers plated in plate conductor layers operation 3308 are pattern to form circuit patterns 3556, 3556A (FIG. 35). In one embodiment, photoresist is applied and patterned, an etch process is performed, and the photoresist is stripped.

FIG. 35 is a cross-sectional view of substrate 3400 of FIG. 34 after performance of pattern conductor layers operation 3310 in accordance with one embodiment. As illustrated, an extended capacitor plate 2604A is formed in and on build-up dielectric layer 3454. Further, electrically conductive vias 1024E are formed through build-up dielectric layers 3454, 3454A.

Substrate 3400 is thus a four metal level substrate having metal layers M1, M2, M3 and M4. Single metal level or multi-level capacitors as set forth in the embodiments above can be formed in any of metal layers M1, M2, M3, M4 and also between metal layers M1, M2 and between metal layers M3, M4.

Although application, laser-ablation of two build-up dielectric layers, plating and patterning of two conductive layer is set forth above, in another embodiment, the operations are performed only on one side of core 3450.

Although formation of embedded capacitors is set forth above, in other embodiments, other passive components are fabricated in a similar manner. These passive components include, without limitation, inductors, transformers, and resistors. Accordingly, although embedded capacitive network substrates and fabrication methods are set forth herein, in other embodiments, embedded passive component network substrates including passive components, e.g., capacitors, inductors, transformers, resistors, and/or combinations thereof, and fabrication methods are provided.

Figure 36:
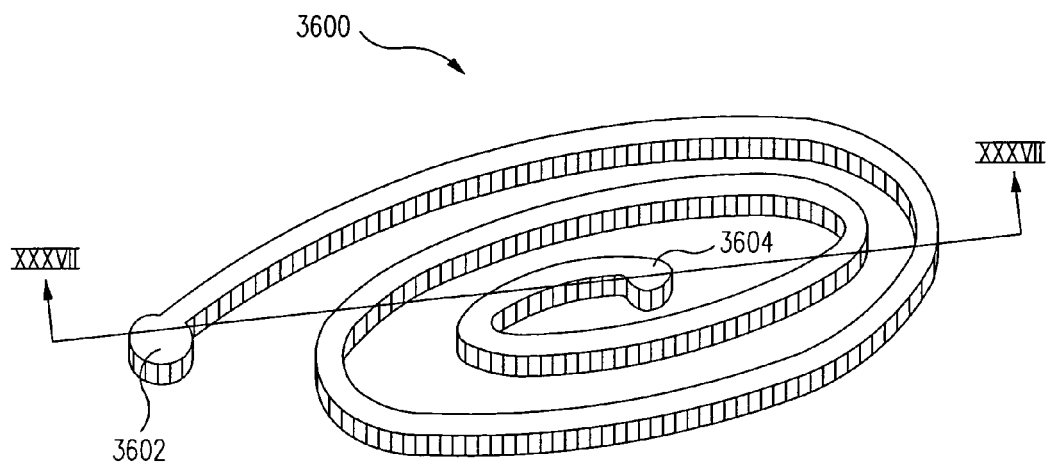
FIG. 36 is a perspective view of an inductor of an embedded passive component network substrate similar to the embedded capacitive network substrate of FIG. 10 in accordance with another embodiment.
Figure 37:
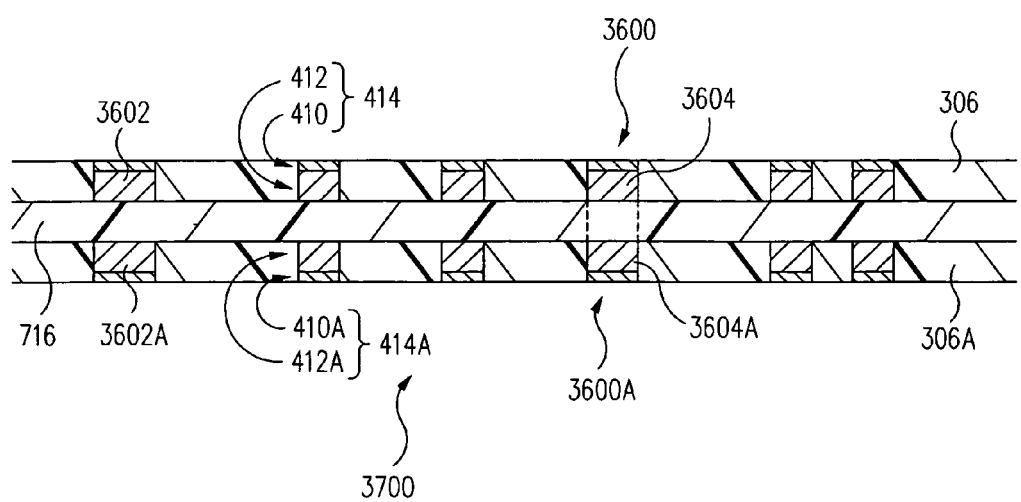
FIG. 37 is a cross-sectional view of the inductor of the embedded passive component network substrate along the line XXXVII-XXXVII of FIG. 36.

To illustrate, FIG. 36 is a perspective view of an inductor 3600 of an embedded passive component network substrate similar to the embedded capacitive network substrate of FIG. 10 in accordance with another embodiment. FIG. 37 is a cross-sectional view of inductor 3600 of an embedded passive component network substrate 3700 along the line XXXVII-XXXVII of FIG. 36. Embedded passive component network substrate 3700 is fabricated using a method similar to embedded capacitive network substrate formation method 100 of FIG. 1 and only the significant differences between the methods are set forth below.

Referring now to FIGS. 1, 36 and 37 together, performance of operations 102, 104, 106, 108, 110, 114, 116, and possible operations 118, 120, 122, 124, 128, 130, results in the formation of embedded passive component network substrate 3700 including inductor 3600.

In accordance with this embodiment, etch stop metal protected circuit pattern 414 includes electrically conductive traces, lands, and at least one inductor 3600. Inductor 3600 is embedded within patterned dielectric layer 306 thus obviating the need for surface mounted inductors.

As is well known to those of skill in the art, an inductor is a device that stores energy in the form of a magnetic field. In accordance with this embodiment, inductor 3600 includes a conductive spiral within patterned dielectric layer 306, which forms the dielectric material for inductor 3600.

Inductor 3600 includes an outer, e.g., first, terminal 3602 and an inner, e.g., second, terminal 3604. Inductor 3600 spirals inwards, i.e., decreases in radius, from outer terminal 3602 to inner terminal 3604.

In accordance with one embodiment, etch stop metal protected circuit pattern 414A includes electrically conductive traces, lands, and at least one inductor 3600A. Inductor 3600A is embedded within patterned dielectric layer 306A. Inductor 3600A is substantially similar to inductor 3600 and include an outer, e.g., first, terminal 3602A and an inner, e.g., second, terminal 3604A. Although two inductors 3600, 3600A are illustrated, in another embodiment, only one, or more than two, inductors are formed.

Outer terminals 3602, 3602A are electrically coupled to traces embedded within patterned dielectric layer 306, 306A and/or vias extending through intermediary dielectric layer 716.

In the embodiment illustrated, inner terminals 3604, 3604A are capacitively coupled to one another through intermediary dielectric layer 716. In another embodiment, inner terminal 3604, and/or inner terminal 3604A are electrically coupled to one another by an electrically conductive via (indicated by the dashed lines) extending through intermediary dielectric layer 716. In other embodiments, inner terminal 3604, and/or inner terminal 3604A are directly and/or capacitively coupled to other electrically conductive structures.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming an embedded capacitive network substrate comprising:
   providing a first carrier with a first dielectric layer;
   patterning the first dielectric layer to form a first patterned dielectric layer comprising circuit pattern artifacts, the circuit pattern artifacts comprising capacitor plate apertures;
   plating a first etch stop layer within the circuit pattern artifacts;
   plating a first conductor layer on the first etch stop layer and within the circuit pattern artifacts, the first etch stop layer and the first conductor layer forming a first etch stop metal protected circuit pattern comprising a first capacitor; and
   simultaneously laminating the first etch stop metal protected circuit pattern to a first surface of an intermediary dielectric layer and a second etch stop metal protected circuit pattern to a second surface of the intermediary dielectric layer.

2. The method of claim 1 wherein the first capacitor comprises a first capacitor plate and a second capacitor plate separated by the first patterned dielectric layer.

3. The method of claim 2 wherein the first capacitor plate comprises first fingers and the second capacitor plate comprises second fingers.

4. The method of claim 3 wherein the first fingers are interdigitated with the second fingers.

5. The method of claim 2 wherein the first capacitor plate is electrically connected to a first trace and the second capacitor plate is electrically connected to a second trace.

6. The method of claim 5 wherein the first trace is electrically connected to a first voltage source and the second trace is electrically connected to a second voltage source.

7. The method of claim 5 wherein the first capacitor plate, the second capacitor plate, the first trace, and the second trace are all parts of the first etch stop metal protected circuit pattern.

8. The method of claim 5 wherein a first thickness of the first trace and the second trace is equal to a second thickness of the first capacitor plate and the second capacitor plate.

9. The method of claim 1 wherein the second etch stop metal protected circuit pattern comprising a second capacitor.

10. The method of claim 9 further comprising forming electrically conductive vias through the intermediary dielectric layer to electrically connect capacitor plates of the first capacitor to capacitor plates of the second capacitor.

11. A method of forming an embedded capacitive network substrate comprising:
    providing a first carrier with a first dielectric layer;
    patterning the first dielectric layer to form a first patterned dielectric layer comprising circuit pattern artifacts;
    plating a first etch stop layer within the circuit pattern artifacts;
    plating a first conductor layer on the first etch stop layer and within the circuit pattern artifacts, the first etch stop layer and the first conductor layer forming a first etch stop metal protected circuit pattern;
    applying a photoresist layer to the first etch stop metal protected circuit pattern and the first patterned dielectric layer;
    patterning the photoresist layer to form a patterned photoresist layer, the patterned photoresist layer comprising capacitor plate extension artifacts exposing portions of the first etch stop metal protected circuit pattern; and
    plating a first patterned capacitor plate extension layer within the capacitor plate extension artifacts.

12. The method of claim 11 wherein the portions of the first etch stop metal protected circuit pattern comprise a capacitor, the capacitor and the patterned capacitor plate extension layer forming an extended plate capacitor.

13. The method of claim 12 wherein the extended plate capacitor comprises a first extended capacitor plate and a second extended capacitor plate.

14. The method of claim 13 wherein the first extended capacitor plate and the second extended capacitor plate are formed in a same metal level.

15. The method of claim 13 wherein the first extended capacitor plate is electrically connected to a first trace and the second extended capacitor plate is electrically connected to a second trace.

16. The method of claim 15 wherein a thickness of the first trace and the second trace is less than a thickness of the first extended capacitor plate and the second extended capacitor plate.

17. The method of claim 11 wherein the first patterned capacitor plate extension layer is on and protrudes from the first etch stop metal protected circuit pattern.

18. The method of claim 11 further comprising laminating the first etch stop metal protected circuit pattern and the first patterned capacitor plate extension layer to a first surface of an intermediary dielectric layer and a second etch stop metal protected circuit pattern and a second patterned capacitor plate extension layer to a second surface of the intermediary dielectric layer, wherein a first extended capacitor plate and a second extended capacitor plate of an extended plate capacitor are formed in different metal levels.

19. A method of forming an embedded capacitive network substrate comprising:
    forming a first circuit pattern within a first patterned dielectric layer;
    forming a first patterned capacitor plate extension layer on the first circuit pattern;
    subsequent to the forming a first patterned capacitor plate extension layer, laminating the first circuit pattern and the first patterned dielectric layer to a core;
    applying a first build-up dielectric layer to cover the first patterned capacitor plate extension layer; and
    forming circuit pattern artifacts in the first build-up dielectric layer, the circuit pattern artifacts comprising capacitor plate apertures.

20. A method of forming an embedded passive component network substrate comprising:
    providing a first carrier with a first dielectric layer;
    patterning the first dielectric layer to form a first patterned dielectric layer comprising circuit pattern artifacts;
    plating a first etch stop layer within the circuit pattern artifacts;
    plating a first conductor layer on the first etch stop layer and within the circuit pattern artifacts, the first etch stop layer and the first conductor layer forming a first etch stop metal protected circuit pattern comprising a passive component; and
    simultaneously laminating the first etch stop metal protected circuit pattern to a first surface of an intermediary dielectric layer and a second etch stop metal protected circuit pattern to a second surface of the intermediary dielectric layer.

21. The method of claim 20 wherein the passive component comprises an inductor comprising a first terminal and a second terminal.

22. The method of claim 21 wherein the inductor spirals inwards from the first terminal to the second terminal.

23. A method of forming an embedded passive component network substrate comprising:
    forming a first patterned dielectric layer comprising circuit pattern artifacts;
    forming a first etch stop layer within the circuit pattern artifacts;
    forming a first conductor layer on the first etch stop layer and within the circuit pattern artifacts, the first etch stop layer and the first conductor layer forming a first etch stop metal protected circuit pattern comprising a passive component embedded in the patterned dielectric layer; and
    simultaneously laminating the first etch stop metal protected circuit pattern to a first surface of an intermediary dielectric layer and a second etch stop metal protected circuit pattern to a second surface of the intermediary dielectric layer.

24. The method of claim 23 wherein the passive component is selected from the group consisting of a capacitor, an inductor, a transformer, a resistor, and combinations thereof.

\* \* \* \* \*